US012796069B2

(12) United States Patent
Tung et al.

(10) Patent No.: US 12,796,069 B2
(45) Date of Patent: Nov. 10, 2026

(54) SEMICONDUCTOR STRUCTURE

(71) Applicant: Taiwan Semiconductor Manufacturing Company, Ltd., Hsinchu (TW)

(72) Inventors: Yu-Lung Tung, Kaohsiung City (TW); Xiaodong Wang, Hsinchu City (TW); Jhon-Jhy Liaw, Zhudong Township, Hsinchu County (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 835 days.

(21) Appl. No.: 18/185,611

(22) Filed: Mar. 17, 2023

(65) Prior Publication Data

US 2024/0312988 A1 Sep. 19, 2024

(51) Int. Cl.

| | |
|---|---|
| ***H01L 27/088*** | (2006.01) |
| ***H01L 27/092*** | (2006.01) |
| ***H01L 29/06*** | (2006.01) |
| ***H01L 29/423*** | (2006.01) |
| ***H01L 29/66*** | (2006.01) |
| ***H01L 29/78*** | (2006.01) |
| ***H10D 30/01*** | (2025.01) |
| ***H10D 30/62*** | (2025.01) |
| ***H10D 30/63*** | (2025.01) |
| ***H10D 30/67*** | (2025.01) |
| ***H10D 62/10*** | (2025.01) |
| ***H10D 64/27*** | (2025.01) |
| ***H10D 84/83*** | (2025.01) |
| ***H10D 84/85*** | (2025.01) |

(52) U.S. Cl.
CPC ......... *H10D 84/834* (2025.01); *H10D 30/031* (2025.01); *H10D 30/62* (2025.01); *H10D 30/63* (2025.01); *H10D 30/6735* (2025.01); *H10D 62/118* (2025.01); *H10D 64/518* (2025.01); *H10D 84/853* (2025.01)

(58) Field of Classification Search
CPC .. H10D 30/014; H10D 30/024; H10D 30/031; H10D 30/43; H10D 30/62; H10D 30/6211; H10D 30/6212; H10D 30/6213; H10D 30/63; H10D 30/6735; H10D 62/118; H10D 62/119; H10D 62/121; H10D 64/518; H10D 84/0158; H10D 84/0193; H10D 84/834; H10D 84/853
See application file for complete search history.

(56) References Cited

U.S. PATENT DOCUMENTS 9,209,247 B2 12/2015 Colinge et al.
9,236,267 B2 1/2016 De et al.
9,412,817 B2 8/2016 Yang et al.

(Continued)

*Primary Examiner* — David C Spalla
(74) *Attorney, Agent, or Firm* — Cooper Legal Group, LLC

(57) ABSTRACT

Semiconductor structures are provided. A semiconductor structure includes a hybrid unit cell. The hybrid unit cell includes at least one first sub-cell having a first cell height and at least one second sub-cell having a second cell height. The first sub-cell includes a plurality of first gate-all-around (GAA) nanosheet transistors. The second sub-cell includes a plurality of second GAA nanosheet transistors. The first cell height is higher than the second cell height, and the first GAA nanosheet transistor has a wider nanosheet width than the second GAA nanosheet transistor.

20 Claims, 13 Drawing Sheets

(56) References Cited

U.S. PATENT DOCUMENTS

| | | | |
|---|---|---|---|
| 9,412,828 | B2 | 8/2016 | Ching et al. |
| 9,472,618 | B2 | 10/2016 | Oxland |
| 9,502,265 | B1 | 11/2016 | Jiang et al. |
| 9,520,482 | B1 | 12/2016 | Chang et al. |
| 9,536,738 | B2 | 1/2017 | Huang et al. |
| 9,576,814 | B2 | 2/2017 | Wu et al. |
| 9,608,116 | B2 | 3/2017 | Ching et al. |
| 2023/0290784 | A1 * | 9/2023 | Do ......................... H10D 30/43 |

* cited by examiner

SEMICONDUCTOR STRUCTURE

BACKGROUND

Integrated circuits (ICs) have become increasingly important. Applications using ICs are used by millions of people. These applications include cell phones, smartphones, tablets, laptops, notebook computers, PDAs, wireless email terminals, MP3 audio and video players, and portable wireless web browsers. Integrated circuits increasingly include powerful and efficient on-board data storage and logic circuitry for signal control and processing.

The recent trend in miniaturizing ICs has resulted in smaller devices which consume less power, yet provide more functionality at higher speeds than before. The miniaturization process has also resulted in various developments in IC designs and/or manufacturing processes to ensure the desired production yield and the intended performance.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
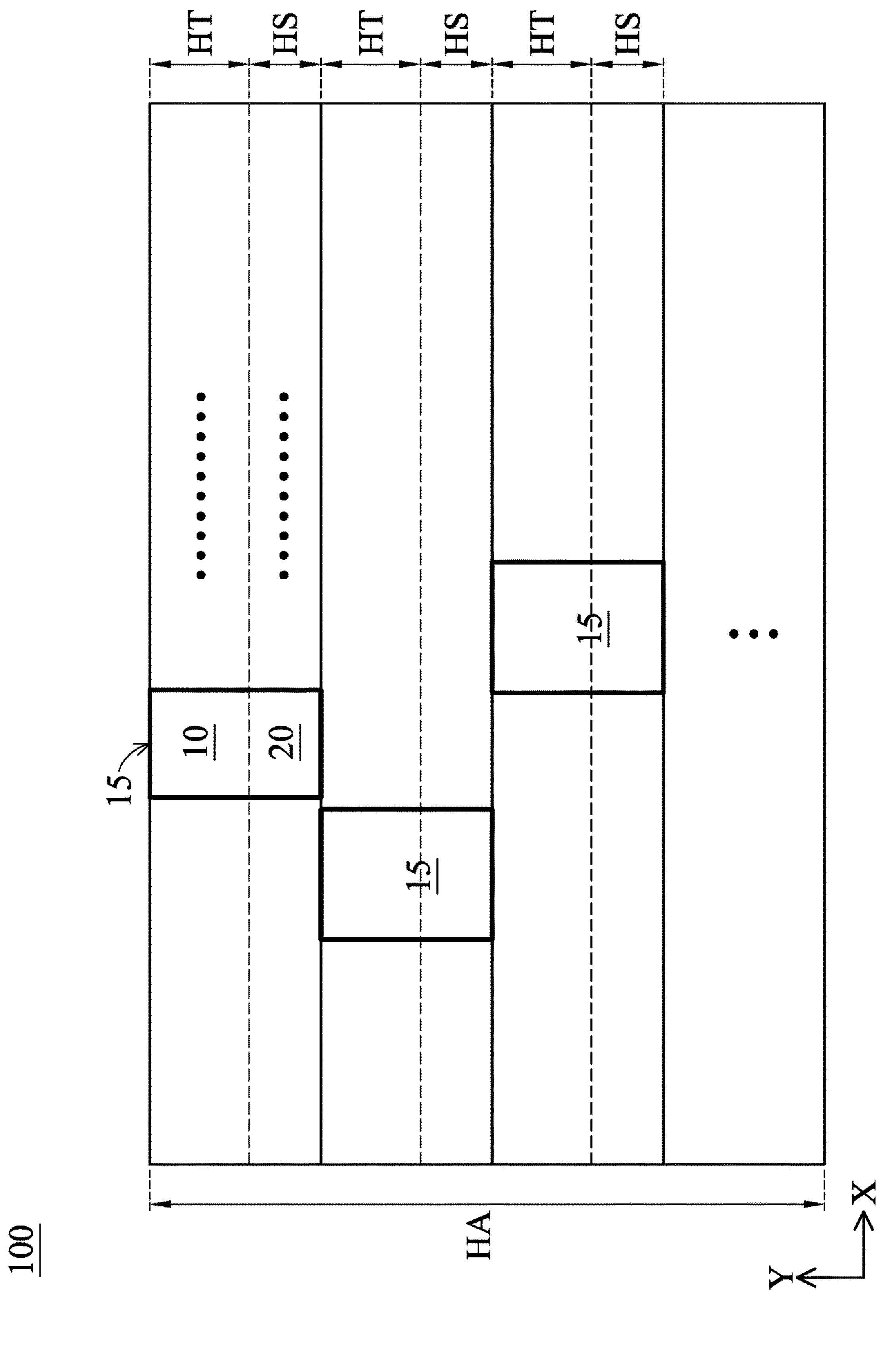
FIG. 1 is a simplified diagram of a hybrid cell array of an IC, in accordance with some embodiments of the disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Some variations of the embodiments are described. Throughout the various views and illustrative embodiments, like reference numbers are used to designate like elements. It should be understood that additional operations can be provided before, during, and/or after a disclosed method, and some of the operations described can be replaced or eliminated for other embodiments of the method.

Further, spatially relative terms, such as “beneath,” “below,” “lower,” “above,” “upper” and the like, may be used herein for ease of description to describe one element or feature’s relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Various semiconductor structures of integrated circuits (ICs) are provided in accordance with various exemplary embodiments. Some variations of some embodiments are discussed. Throughout the various views and illustrative embodiments, like reference numbers are used to designate like elements.

The disclosure is generally related to semiconductor devices, and more particularly to circuit cells having three-dimensional gate-all-around (GAA) transistors, in an integrated circuit (IC) structure. Generally, a GAA transistor may include a plurality of vertically stacked sheets (e.g., nanosheets), wires (e.g., nanowires), or rods (e.g., nanorods) in a channel region of the transistor, thereby allowing better gate control, lowered leakage current, and improved scaling capability for various IC applications.

The nanostructure transistor (e.g. nanosheet transistor, nanowire transistor, multi-bridge channel, nano-ribbon FET, gate all around (GAA) transistor structures) described below may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, smaller pitches than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the GAA structure.

FIG. 1 is a simplified diagram of a hybrid cell array 100 of an IC, in accordance with some embodiments of the disclosure. The hybrid cell array 100 includes multiple hybrid unit cells 15, and each hybrid cell includes a first sub-cell 10 and a second sub-cell 20. In some embodiments, the hybrid unit cells 15 are the standard cells (e.g., INV (inverter), AND, OR, NAND, NOR, Flip-Flop, SCAN, etc.), a combination thereof or specific functional cells. Furthermore, the logic functions of the first sub-cells 10 and the second sub-cells 20 may be the same or different. Furthermore, each of the first sub-cells 10 and the second sub-cells 20 includes multiple transistors. In some embodiments, the first sub-cells 10 and the second sub-cells 20 corresponding to the same function or operation may have the same circuit configuration with different semiconductor structures and/or different layouts.

In FIG. 1, the first sub-cells 10 have the same cell height HT along the Y-direction in the layout, and the second sub-cells 20 have the same cell height HS along the Y-direction in the layout. A cell height of the hybrid unit cell 15 is equal to a sum of the cell heights HT and HS. The cell height HT of the first sub-cells 10 is higher than the cell height HS of the second sub-cells 20, i.e., HS<HT. In each hybrid unit cell 15, the first sub-cells 10 and the second sub-cells 20 have the same cell widths along the X-direction in the layout. Furthermore, the hybrid unit cells 15 in the hybrid cell array 100 may have the same or different cell widths along the X-direction in the layout. It should be noted that the number and the configuration of the first sub-cells 10 and the second sub-cells 20 are used as an example, and not to limit the disclosure.

In FIG. 1, the sub-rows corresponding to the first sub-cells 10 and the sub-rows corresponding to the second sub-cells 20 are staggered in the hybrid cell array 100. It should be noted that the first sub-cell 10 and the second sub-cell 20 are not arranged in the same sub-row.

In some embodiments, the transistors in the first sub-cells 10 and the second sub-cells 20 are selected from a group consisting of vertical gate all around (GAA), horizontal GAA, nano wire, nano sheet, or a combination thereof. In some embodiments, the first sub-cells 10 (or the second sub-cells 20) in the same sub-row are electrically isolated from each other by the isolation region, e.g., the shallow trench isolation (STI). In some embodiments, the first sub-cells 10 (or the second sub-cells 20) in the same sub-row are electrically isolated by the transistors.

Figure 2:
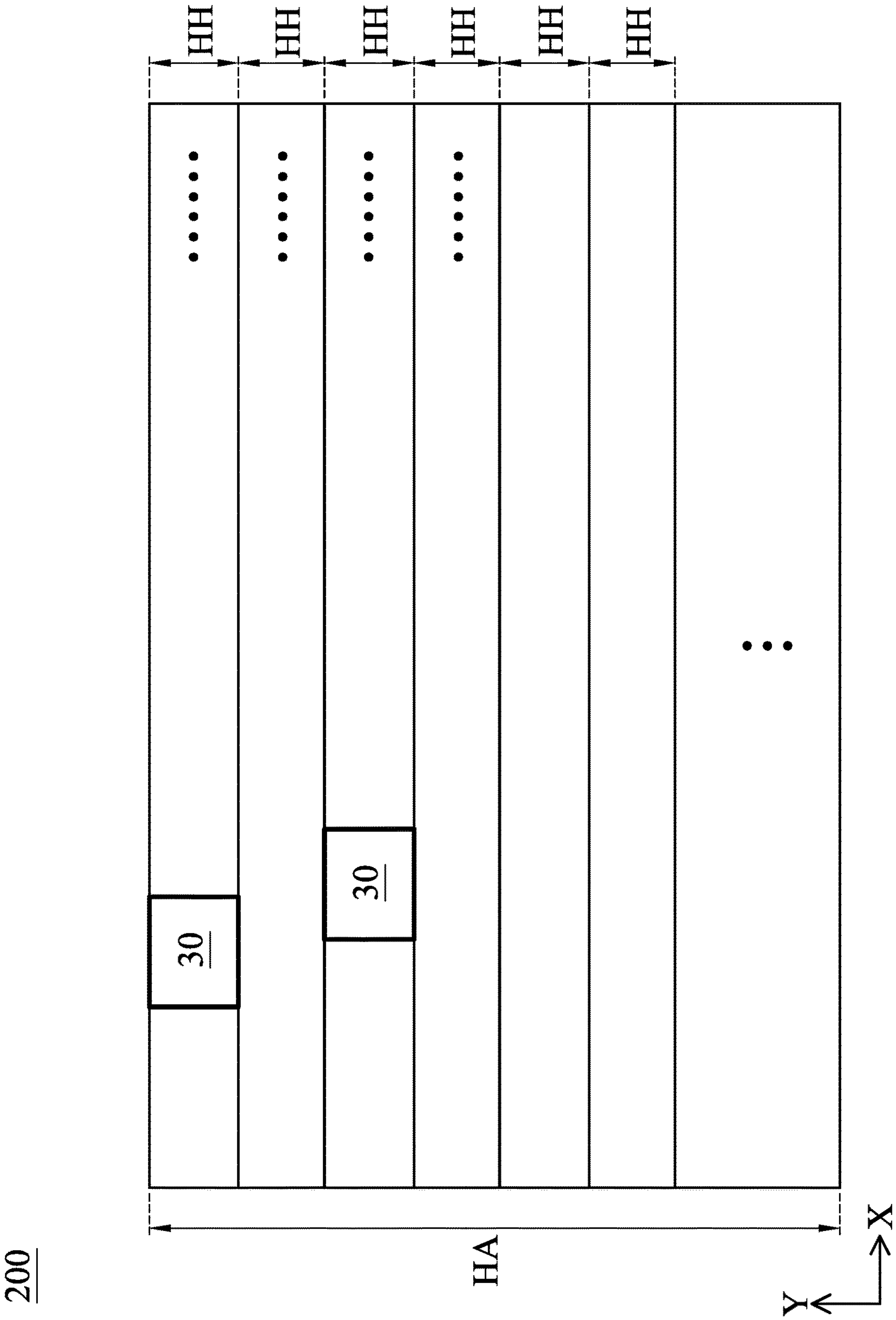
FIG. 2 is a simplified diagram of a regular cell array of an IC, in accordance with some embodiments of the disclosure.

FIG. 2 is a simplified diagram of a regular cell array 200 of an IC, in accordance with some embodiments of the disclosure. The regular cell array 200 includes multiple logic cells 30. In some embodiments, the logic cells 30 are the standard cells (e.g., INV (inverter), AND, OR, NAND, NOR, Flip-Flop, SCAN, etc.), a combination thereof or specific functional cells. Furthermore, the logic functions of the logic cells 30 may be the same or different. Each logic cell 30 includes multiple transistors. In some embodiments, the logic cells 30 corresponding to the same function or operation may have the same circuit configuration with different semiconductor structures and/or different layouts.

In FIG. 2, the regular cell array 100 has an array height HA along the Y-direction in the layout, and the logic cells 30 have the same cell height HH (e.g., along the Y-direction) in the layout. Furthermore, the logic cells 30 may have the same or different cell widths (e.g., along the X-direction) in the layout. It should be noted that the number and the configuration of the logic cells 30 are used as an example, and not to limit the disclosure.

In some embodiments, the transistors in the logic cells 30 are selected from a group consisting of vertical gate all around (GAA), horizontal GAA, nano wire, nano sheet, or a combination thereof. In some embodiments, the logic cells 30 in the same row are electrically isolated from each other by the isolation region, e.g., the shallow trench isolation (STI). In some embodiments, the logic cells 30 in the same row are electrically isolated by the transistors.

In some embodiments, the regular cell array 200 of FIG. 2 and the hybrid cell array 100 of FIG. 1 are implemented in the same IC. Furthermore, the cell height HT of the first sub-cells 10 is higher than the cell height HH of the logic cells 30, and the cell height HH of the logic cells 30 is higher than the cell height HS of the second sub-cells 20, i.e., HS<HH<HT. In some embodiments, the regular cell array 200 of FIG. 2 and the hybrid cell array 100 of FIG. 1 have the same array height HA along the Y-direction in the layout. In some embodiments, the sum of the cell height HT of the first sub-cell 10 and the cell height HS of the second sub-cell 20 is equal to twice the cell height HH of the logic cell 30 (i.e., HT+HS=2×HH), and the number of rows in the hybrid cell array 100 of FIG. 1 is equal to the number of rows in the regular cell array 200 of FIG. 2.

Figure 3:
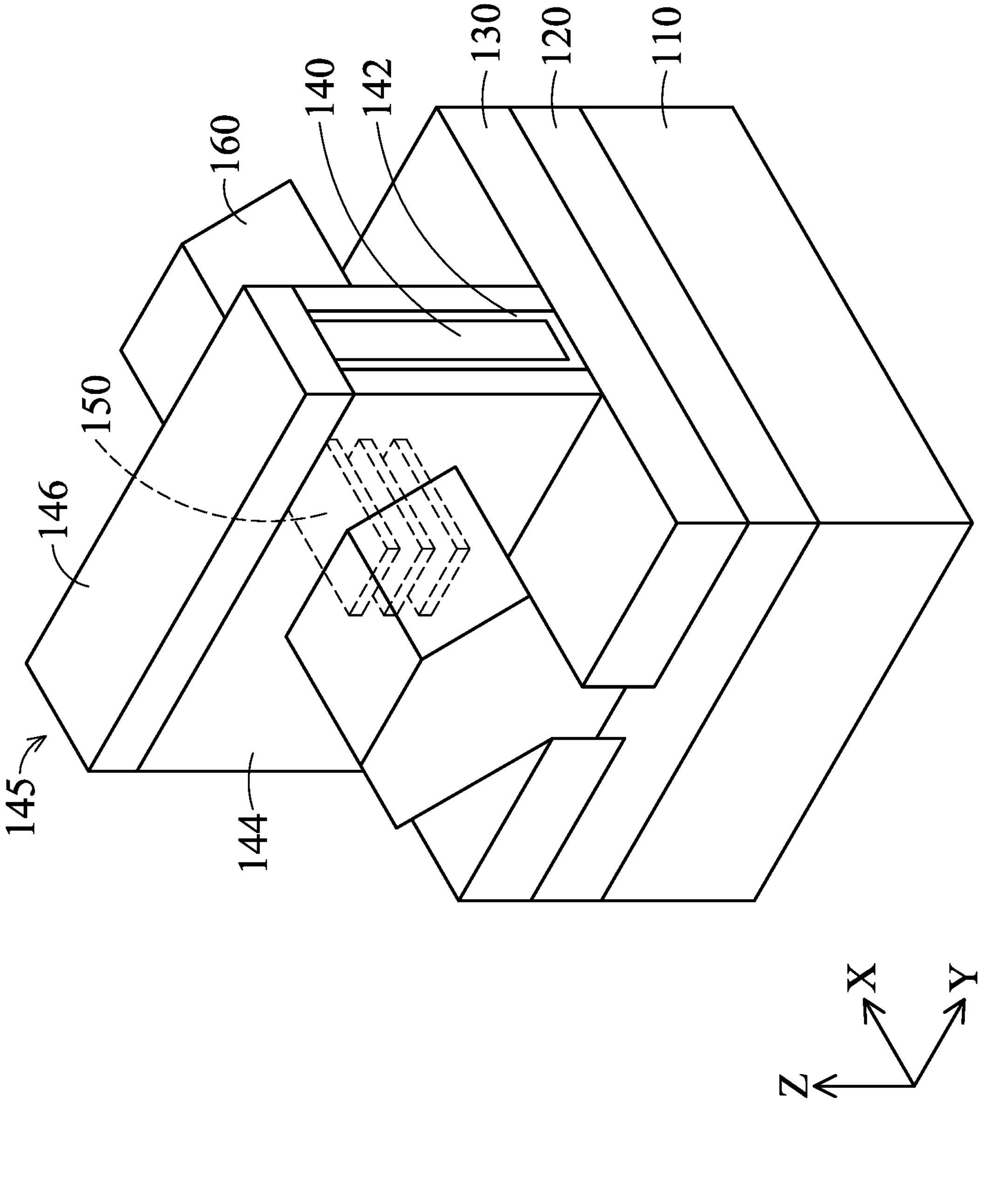
FIG. 3 shows a perspective view of an exemplary GAA transistor, in accordance with some embodiments of the disclosure.

FIG. 3 shows a perspective view of an exemplary GAA transistor, in accordance with some embodiments of the disclosure. The GAA transistor includes a substrate 110. The substrate 110 may contains a semiconductor material, such as bulk silicon (Si). In some other embodiments, the substrate 110 may include other semiconductors such as germanium (Ge), silicon germanium (SiGe), or a III-V semiconductor material. Example III-V semiconductor materials may include gallium arsenide (GaAs), indium phosphide (InP), gallium phosphide (GaP), gallium nitride (GaN), gallium arsenide phosphide (GaAsP), aluminum indium arsenide (AlInAs), aluminum gallium arsenide (AlGaAs), gallium indium phosphide (GaInP), and indium gallium arsenide (InGaAs). The substrate 110 may also include an insulating layer, such as a silicon oxide layer, to have a silicon-on-insulator (SOI) structure or a germanium-on-insulator (GOI) structure. In some embodiments, after the resultant GAA transistor is formed, the substrate 110 may be removed by a suitable process (e.g., a chemical mechanical polishing (CMP) process) for forming back-side interconnections.

A well region 120 is formed over the substrate 110. In some embodiments, the well region 120 is a P-type well region for a P-type transistor, and the material of the P-type well region includes Si with Boron (B) doping. In some embodiments, the well region 110 is an N-type well region for an N-type transistor, and the material of the N-type well region includes Si with Phosphorus (P) doping. In some embodiments, the well region 120 can be omitted.

The GAA transistor also includes one or more nanostructures 150 (dash lines) extending in the X-direction and vertically arranged (or stacked) in a Z-direction. The nanostructures 150 form the active regions (or oxide definition (OD) region) over the well region 120. More specifically, the nanostructures 150 are spaced from each other in the Z-direction. In some embodiments, the nanostructures 150 may also be referred to as channels, channel layers, nanosheets, or nanowires. The nanostructures 150 may include a semiconductor material, such as silicon, germanium, silicon carbide, silicon phosphide, gallium arsenide, gallium phosphide, indium phosphide, indium arsenide, and/or indium antimonide, silicon germanium (SiGe), SiPC, GaAsP, AlInAs, AlGaAs, GaInAs, GaInP, and/or GaInAsP. In some embodiments, the nanostructures 150 include silicon for N-type GAA transistors. In other embodiments, the nanostructures 150 include silicon germanium for P-type GAA transistors. In some embodiments, the nanostructures 150 are all made of silicon, and the type of GAA transistors depend on work function metal layer wrapping around the nanostructures 150.

The GAA transistor further includes a gate structure 145 extending in the Y-direction and includes a gate electrode 140 and a gate dielectric layer 142. The gate dielectric layer 142 wraps around the nanostructures 150 and the gate electrode 140 wraps around the gate dielectric layer 142 (not shown). The gate electrode 140 may include polysilicon or work function metal. The work function metal includes TiN, TaN, TiAl, TiAlN, TaAl, TaAlN, TaAlC, TaCN, WNC, Co, Ni, Pt, W, combinations thereof, or other suitable material.

In some embodiments, the gate electrode 140 may include a capping layer, a barrier layer, an n-type work function metal layer, a p-type work function metal layer, and a fill material (not shown). In some embodiments, the P-type transistors and the N-type transistors are formed by the same work function material. In some embodiments, the P-type transistors and the N-type transistors are made of different work function materials.

The gate dielectric layer 142 may include dielectric materials, such as silicon oxide, silicon nitride, silicon oxynitride, dielectric material(s) with high dielectric constant (high-k), or a combination thereof. Examples of high-k dielectric materials include $TiO_2$, HfZrO, $Ta_2O_3$, $HfSiO_4$, $ZrO_2$, $ZrSiO_2$, LaO, AlO, ZrO, TiO, $Ta_2O_5$, $Y_2O_3$, $SrTiO_3$ (STO), $BaTiO_3$ (BTO), BaZrO, HfLaO, HfSiO, LaSiO, AlSiO, HfTaO, HfTiO, $(Ba,Sr)TiO_3$ (BST), $Al_2O_3$, $Si_3N_4$, oxynitrides (SiON), combinations thereof, or other suitable material.

The gate spacers 144 are on sidewalls of the gate dielectric layer 142 and over the nanostructures 150 (not shown). The gate spacers 144 may include multiple dielectric materials and be selected from a group consisting of silicon nitride ($Si_3N_4$), silicon oxide ($SiO_2$), silicon carbide (SiC), silicon oxycarbide (SiOC), silicon oxynitride (SiON), silicon oxycarbon nitride (SiOCN), carbon doped oxide, nitrogen doped oxide, porous oxide, air gap, or a combination thereof. In some embodiments, the gate spacers 144 may include a single layer or a multi-layer structure.

The gate top dielectric layer 146 is over the gate dielectric layer 142, the gate electrode 140, and the nanostructures 150. The gate top dielectric layer 146 is used for contact etch protection layer. The material of gate top dielectric layer 146 is selected from a group consisting of oxide, SiOC, SiON, SiOCN, nitride base dielectric, metal oxide dielectric, Hf oxide ($HfO_2$), Ta oxide ($Ta_2O_5$), Ti oxide ($TiO_2$), Zr oxide ($ZrO_2$), Al oxide ($Al_2O_3$), Y oxide ($Y_2O_3$), combinations thereof, or other suitable material.

The GAA transistor further includes epitaxially-grown materials 160. As shown in FIG. 3, two epitaxially-grown materials 160 are on opposite sides of the gate structure 145. The epitaxially-grown materials 160 serve as the source/drain features of the GAA transistor. Therefore, the epitaxially-grown materials 160 may also be referred to as source/drain, source/drain features, or source/drain nodes. Source/drain region(s) may refer to a source or a drain, individually or collectively dependent upon the context. In some embodiments, for an N-type GAA transistor, the epitaxially-grown materials 160 may include SiP, SiC, SiPC, SiAs, Si, or a combination thereof. In some embodiments, for a P-type GAA transistor, the epitaxially-grown materials 160 may include SiGe, SiGeC, Ge, Si, a boron-doped SiGe, boron and carbon doped SiGe, or a combination thereof.

The nanostructures 150 (dash lines) extends in the X-direction to connect two epitaxially-grown materials 160. Such the nanostructures 150 and the epitaxially-grown materials 160 connected continuously with each other may be collectively referred to as an active area.

Isolation feature 130 is over the substrate 110 and under the gate dielectric layer 142, the gate electrode 140, and the gate spacers 144. The isolation feature 130 is used for isolating the GAA transistor from other devices. In some embodiments, the isolation feature 130 may include different structures, such as shallow trench isolation (STI) structure, deep trench isolation (DTI) structure. Therefore, the isolation feature 130 is also referred as to as a STI feature or DTI feature.

Figure 4B:
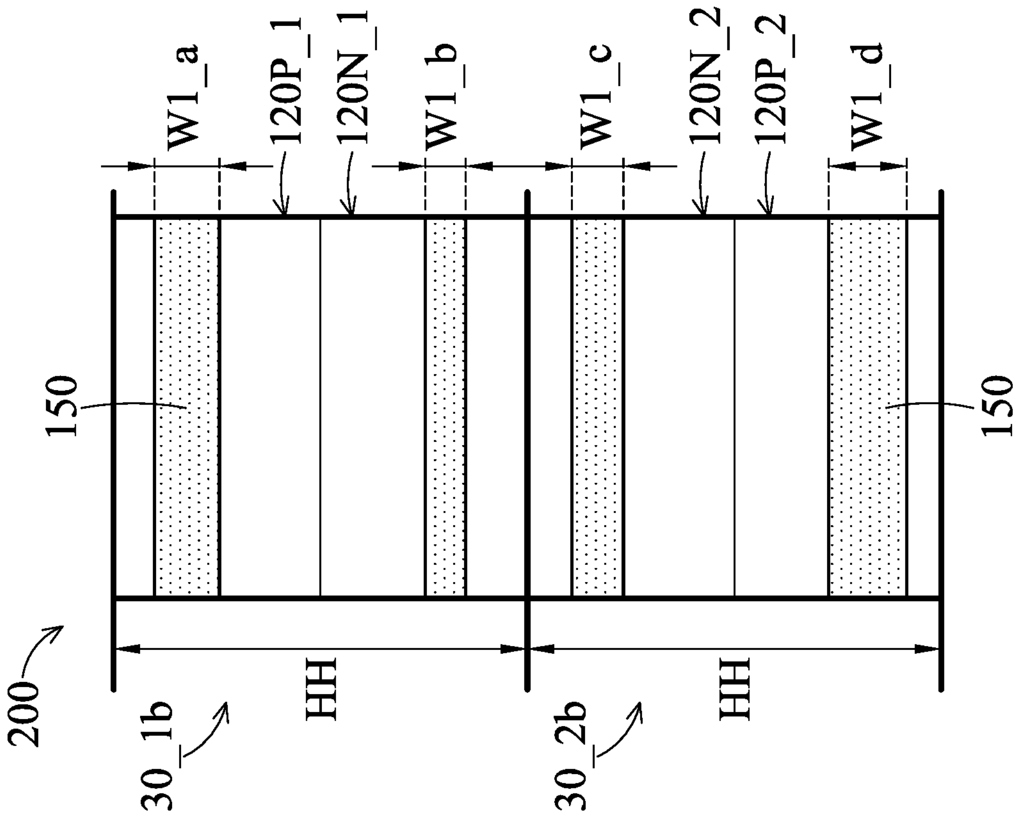
FIG. 4B illustrates the adjacent logic cells in the regular cell array of FIG. 2, in accordance with some embodiments of the disclosure.
Figure 4A:
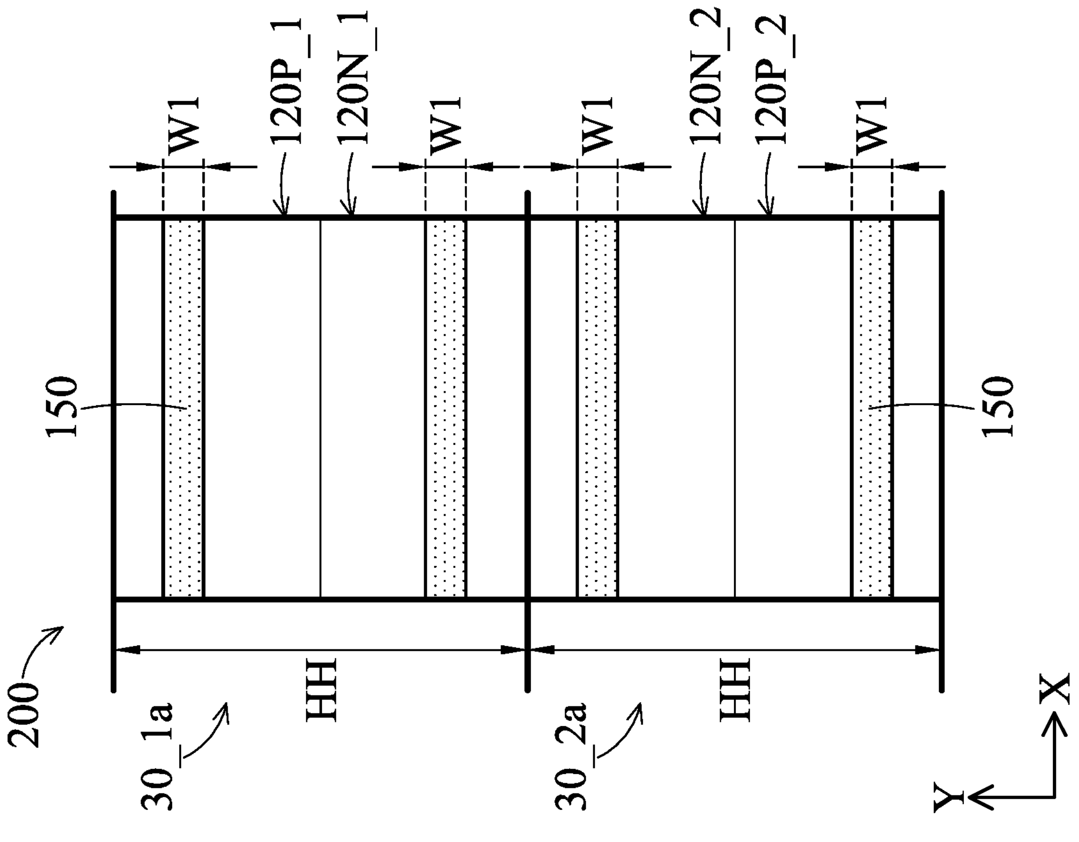
FIG. 4A illustrates the adjacent logic cells in the regular cell array of FIG. 2, in accordance with some embodiments of the disclosure.

FIG. 4A illustrates the adjacent logic cells 30 in the regular cell array 200 of FIG. 2, in accordance with some embodiments of the disclosure. In FIG. 4A, the logic cells 30_1*a* and 30_2*a* are formed in the adjacent rows of the regular cell array 200. For example, the logic cell 30_1*a* is arranged in the upper row of the regular cell array 200, and the logic cell 30_2*a* is arranged in the lower row of the regular cell array 200. Furthermore, the outer boundary of each of the logic cells 30_1*a* and 30_2*a* is example, and is not intended to limit the disclosure. As described above, the logic cells 30_1*a* and 30_2*a* have the same cell height HH in the Y-direction.

In the logic cell 30_1*a*, one or more P-type GAA nanosheet transistors (e.g., GAA transistor of FIG. 3) are formed over the P-type well region 120P_1 (or a P-type device region), and one or more N-type GAA nanosheet transistors (e.g., GAA transistor of FIG. 3) are formed over the N-type well region 120N_1 (or an N-type device region). In order to simplify the description, only the nanosheet structures 150 of the P-type and N-type GAA nanosheet transistors are shown in the logic cell 30. In the logic cell 30_2*a*, one or more P-type GAA nanosheet transistors are formed over the P-type well region 120P_2 (or a P-type device region), and one or more N-type GAA nanosheet transistors are formed over the N-type well region 120N_2 (or an N-type device region). The N-type well region 120N_1 is adjacent to and in contact with the N-type well region 120N_2, i.e., the N-type well regions 120N_1 and 120N_2 are merged into single N-type well region. The P-type well region 120P_1 is separated from the P-type well region 120P_2 by the N-type well regions 120N_1 and 120N_2. In FIG. 4A, the P-type GAA nanosheet transistors and the N-type GAA nanosheet transistors of the logic cells 30 in each row of the regular cell array 200 have the nanosheet structures 150 with the same nanosheet width W1. Therefore, the P-type GAA nanosheet transistors and the N-type GAA nanosheet transistors have symmetry nanosheet structures in the logic cells 30_1*a* and 30_2*b*.

FIG. 4B illustrates the adjacent logic cells 30 in the regular cell array 200 of FIG. 2, in accordance with some embodiments of the disclosure. In FIG. 4B, the logic cells 30_1*b* and 30_2*b* are formed in the adjacent rows of the regular cell array 200. The configuration of the logic cells 30_1*b* and 30_2*b* in FIG. 4B is similar to the configuration of the logic cells 30_1*a* and 30_2*a* in FIG. 4A, and the difference between the logic cells 30_1$b$ and 30_2$b$ in FIG. 4B and the logic cells 30_1$a$ and 30_2$a$ in FIG. 4A is that the P-type GAA nanosheet transistors and the N-type GAA nanosheet transistors have different nanosheet widths in the logic cells 30_1$b$ and 30_2$b$. Therefore, the P-type GAA nanosheet transistors and the N-type GAA nanosheet transistors have asymmetry nanosheet structures in the logic cells 30_1$b$ and 30_2$b$.

In FIG. 4B, the P-type GAA nanosheet transistors of the logic cells 30 have the same nanosheet width and the N-type GAA nanosheet transistors of the logic cells 30 have the same nanosheet width in the same row of the regular cell array 200. The nanosheet width W1_$a$ of the P-type GAA nanosheet transistors is greater than the nanosheet width W1_$b$ of the N-type GAA nanosheet transistors in the logic cell 30_1$b$ (i.e., W1_$a$>W1_$b$), and the nanosheet width W1_$d$ of the P-type GAA nanosheet transistors is greater than the nanosheet width W1_$c$ of the N-type GAA nanosheet transistors in the logic cell 30_2$b$ (i.e., W1_$d$>W1_$c$). In some embodiments, the nanosheet width W1_$b$ is less than the nanosheet width W1_$c$, the nanosheet width W1_$c$ is less than the nanosheet width W1_$a$, and the nanosheet width W1_$a$ is less than the nanosheet width W1_$d$, i.e., W1_$b$<W1_$c$<W1_$a$<W1_$d$.

Figure 5B:
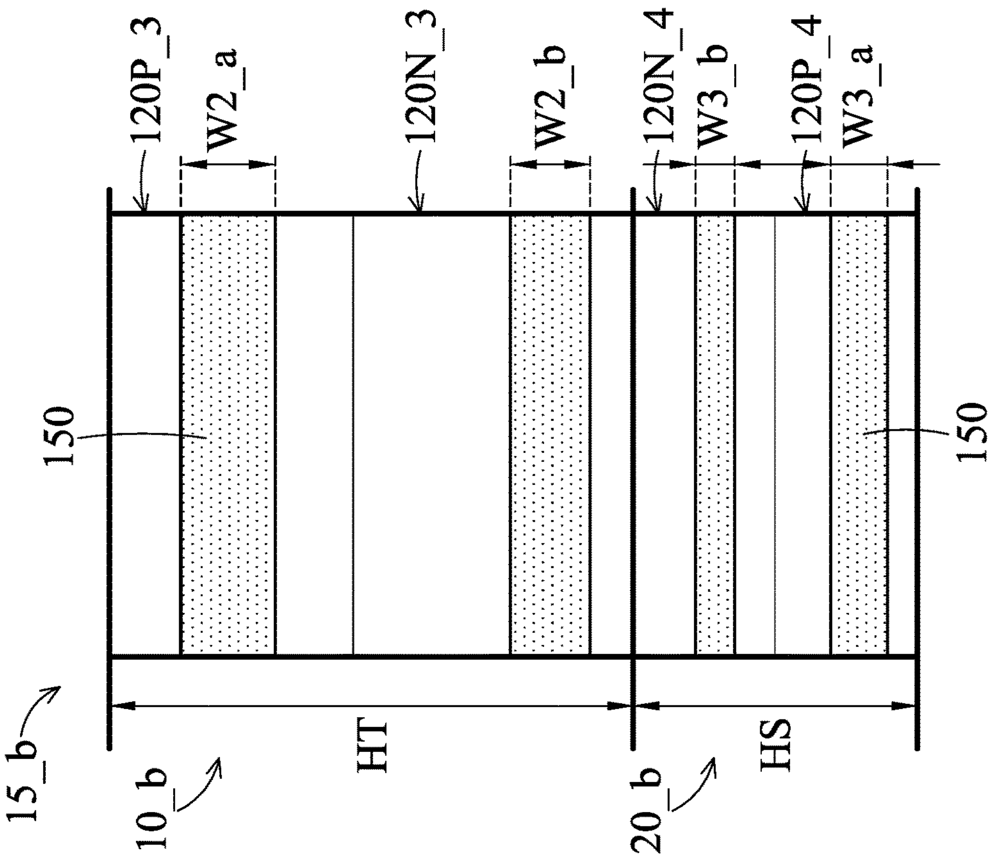
FIG. 5B illustrates a hybrid unit cell in the hybrid cell array of FIG. 1, in accordance with some embodiments of the disclosure.
Figure 5A:
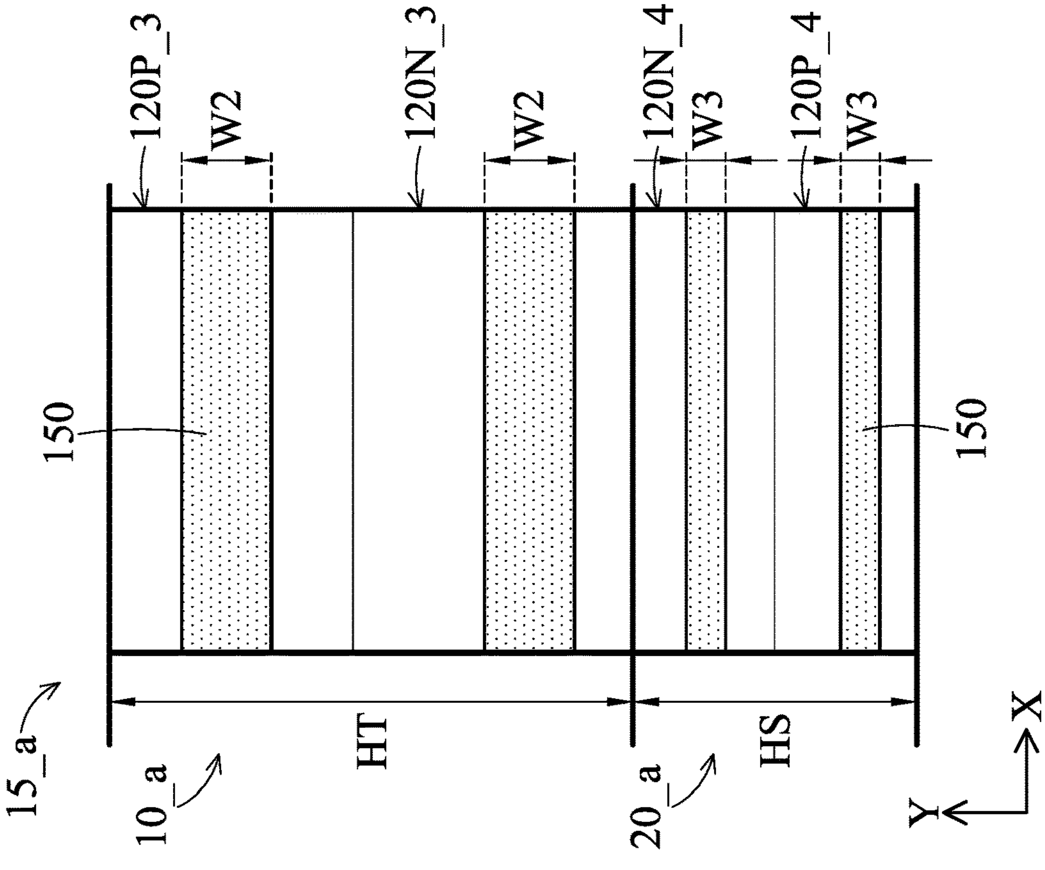
FIG. 5A illustrates a hybrid unit cell in the hybrid cell array of FIG. 1, in accordance with some embodiments of the disclosure.

FIG. 5A illustrates a hybrid unit cell 15_$a$ in the hybrid cell array 100 of FIG. 1, in accordance with some embodiments of the disclosure. In FIG. 5A, the hybrid unit cell 15_$a$ includes the first sub-cell 10_$a$ and the second sub-cell 20_$a$. Furthermore, the outer boundary of each of the sub-cells 10_$a$ and 20_$a$ is example, and is not intended to limit the disclosure. As described above, the cell height HT of the first sub-cell 10_$a$ is greater than the cell height HS of the second sub-cell 20_$a$ in the Y-direction.

In the first sub-cell 10_$a$, one or more P-type GAA nanosheet transistors (e.g., GAA transistor of FIG. 3) are formed over the P-type well region 120P_3 (or a P-type device region), and one or more N-type GAA nanosheet transistors (e.g., GAA transistor of FIG. 3) are formed over the N-type well region 120N_3 (or an N-type device region). In the second sub-cell 20_$a$, one or more P-type GAA nanosheet transistors (e.g., GAA transistor of FIG. 3) are formed over the P-type well region 120P_4 (or a P-type device region), and one or more N-type GAA nanosheet transistors (e.g., GAA transistor of FIG. 3) are formed over the N-type well region 120N_4 (or an N-type device region). In order to simplify the description, only the nanosheet structures 150 of the P-type and N-type GAA nanosheet transistors are shown in the sub-cells 10 and 20. The N-type well region 120N_3 is adjacent to and in contact with the N-type well region 120N_4, i.e., the N-type well regions 120N_3 and 120N_4 are merged into single N-type well region. The P-type well region 120P_3 is separated from the P-type well region 120P_4 by the N-type well regions 120N_3 and 120N_4.

In FIG. 5A, the P-type GAA nanosheet transistors of the same type of sub-cells (not shown) have the same nanosheet width and the N-type GAA nanosheet transistors of the same type of sub-cells (not shown) have the same nanosheet width in the same row of the hybrid cell array 100. The P-type GAA nanosheet transistors and the N-type GAA nanosheet transistors in the first sub-cell 10_$a$ have the nanosheet structures 150 with the same nanosheet width W2, and the P-type GAA nanosheet transistors and the N-type GAA nanosheet transistors in the second sub-cell 20_$a$ have the nanosheet structures 150 with the same nanosheet width W3. Therefore, the P-type GAA nanosheet transistors and the N-type GAA nanosheet transistors have symmetry nanosheet structures in the first sub-cell 10_$a$, and the P-type GAA nanosheet transistors and the N-type GAA nanosheet transistors have symmetry nanosheet structures in the second sub-cell 20_$a$. It should be noted that the nanosheet width W2 is greater than the nanosheet width W3, i.e., W2>W3. Therefore, the first sub-cell 10_$a$ is used for higher operation speed and the second sub-cell 20_$a$ is used for lower power.

FIG. 5B illustrates a hybrid unit cell 15_$b$ in the hybrid cell array 100 of FIG. 1, in accordance with some embodiments of the disclosure. In FIG. 5B, the hybrid unit cell 15_$a$ includes the first sub-cell 10_$b$ and the second sub-cell 20_$b$. The configuration of the hybrid unit cell 15_$b$ in FIG. 5B is similar to the configuration of the hybrid unit cell 15_$a$ in FIG. 5A, and the difference between the hybrid unit cell 15_$b$ of FIG. 5B and the hybrid unit cell 15_$a$ of FIG. 5A is that the P-type GAA nanosheet transistors and the N-type GAA nanosheet transistors have different nanosheet widths in the first sub-cell 10_$b$ and the second sub-cell 20_$b$ of the hybrid unit cell 15_$b$. Therefore, the P-type GAA nanosheet transistors and the N-type GAA nanosheet transistors have asymmetry nanosheet structures in the first sub-cell 10_$b$ and the second sub-cell 20_$b$. Furthermore, the different nanosheet widths allows further speed and power partitioning within each of the sub-cells 10 and 20.

In FIG. 5B, the P-type GAA nanosheet transistors of the same type of sub-cells (not shown) have the same nanosheet width and the N-type GAA nanosheet transistors of the same type of sub-cells (not shown) have the same nanosheet width in the same row of the hybrid cell array 100. In the first sub-cell 10_$b$, the nanosheet width W2_$a$ of the P-type GAA nanosheet transistors is greater than the nanosheet width W2_$b$ of the N-type GAA nanosheet transistors (i.e., W2_$a$>W2_$b$). In the second sub-cell 20_$b$, the nanosheet width W3_$a$ of the P-type GAA nanosheet transistors is greater than the nanosheet width W3_$b$ of the N-type GAA nanosheet transistors (i.e., W3_$a$>W3_$b$). In some embodiments, the nanosheet width W3_$a$ is less than the nanosheet width W2_$b$, i.e., W3_$a$<W2_$b$. Therefore, all of the nanosheet widths (e.g., W2_$a$ and W2_$b$) of the first sub-cell 10_$b$ are greater than all of the nanosheet widths (e.g., W3_$a$ and W3_$b$) of the second sub-cell 20_$b$.

Figure 5C:
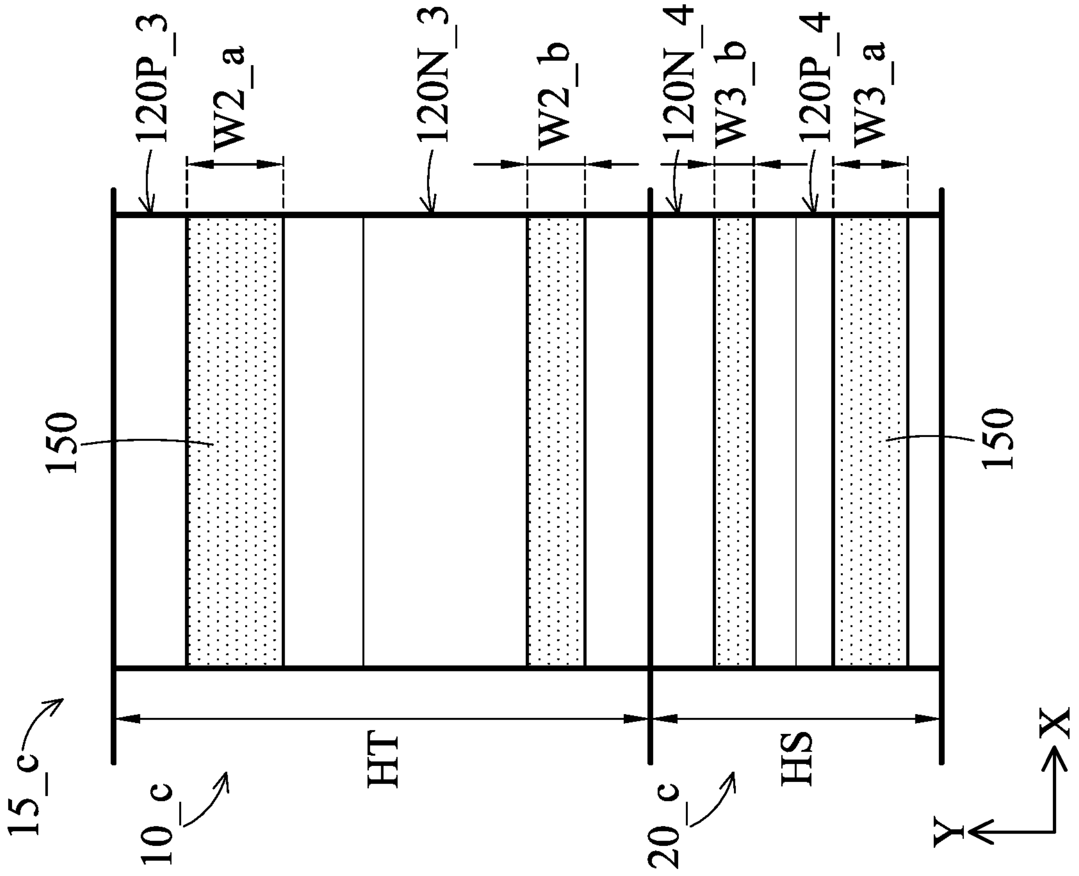
FIG. 5C illustrates a hybrid unit cell in the hybrid cell array of FIG. 1, in accordance with some embodiments of the disclosure.

FIG. 5C illustrates a hybrid unit cell 15_$c$ in the hybrid cell array 100 of FIG. 1, in accordance with some embodiments of the disclosure. In FIG. 5C, the hybrid unit cell 15_$c$ includes the first sub-cell 10_$c$ and the second sub-cell 20_$c$. The configuration of the hybrid unit cell 15_$c$ in FIG. 5C is similar to the configuration of the hybrid unit cell 15_$a$ in FIG. 5A, and the difference between the hybrid unit cell 15_$c$ of FIG. 5C and the hybrid unit cell 15_$a$ of FIG. 5A is that the P-type GAA nanosheet transistors and the N-type GAA nanosheet transistors have different nanosheet widths in the first sub-cell 10_$c$ and the second sub-cell 20_$c$ of the hybrid unit cell 15_$c$. Therefore, the P-type GAA nanosheet transistors and the N-type GAA nanosheet transistors have asymmetry nanosheet structures in the first sub-cell 10_$c$ and the second sub-cell 20_$c$.

In FIG. 5C, the P-type GAA nanosheet transistors of the same type of sub-cells (not shown) have the same nanosheet width and the N-type GAA nanosheet transistors of the same type of sub-cells (not shown) have the same nanosheet width in the same row of the hybrid cell array 100. In the first sub-cell 10_$c$, the nanosheet width W2_$a$ of the P-type GAA nanosheet transistors is greater than the nanosheet width W2_$b$ of the N-type GAA nanosheet transistors (i.e., W2_$a$>W2_$b$). In the second sub-cell 20_$c$, the nanosheet width W3_$a$ of the P-type GAA nanosheet transistors is greater than the nanosheet width W3_*b* of the N-type GAA nanosheet transistors (i.e., W3_*a*>W3_*b*). In some embodiments, the nanosheet width W3_*b* is less than the nanosheet width W2_*b*, the nanosheet width W2_*b* is less than the nanosheet width W3_*a*, and the nanosheet width W3_*a* is less than the nanosheet width W2_*a*, i.e., W3_*b*<W2_*b*<W3_*a*<W2_*a*. Therefore, the maximum nanosheet width (e.g., W2_*a*) of the first sub-cell 10_*c* is greater than the maximum nanosheet width (e.g., W3_*a*) of the second sub-cell 20_*c*, and the minimum nanosheet width (e.g., W2_*b*) of the first sub-cell 10_*c* is greater than the minimum nanosheet width (e.g., W3_*b*) of the second sub-cell 20_*c*. Moreover, the minimum nanosheet width (e.g., W2_*b*) of the first sub-cell 10_*c* is less than the maximum nanosheet width (e.g., W3_*a*) of the second sub-cell 20_*c*.

Figure 6A:
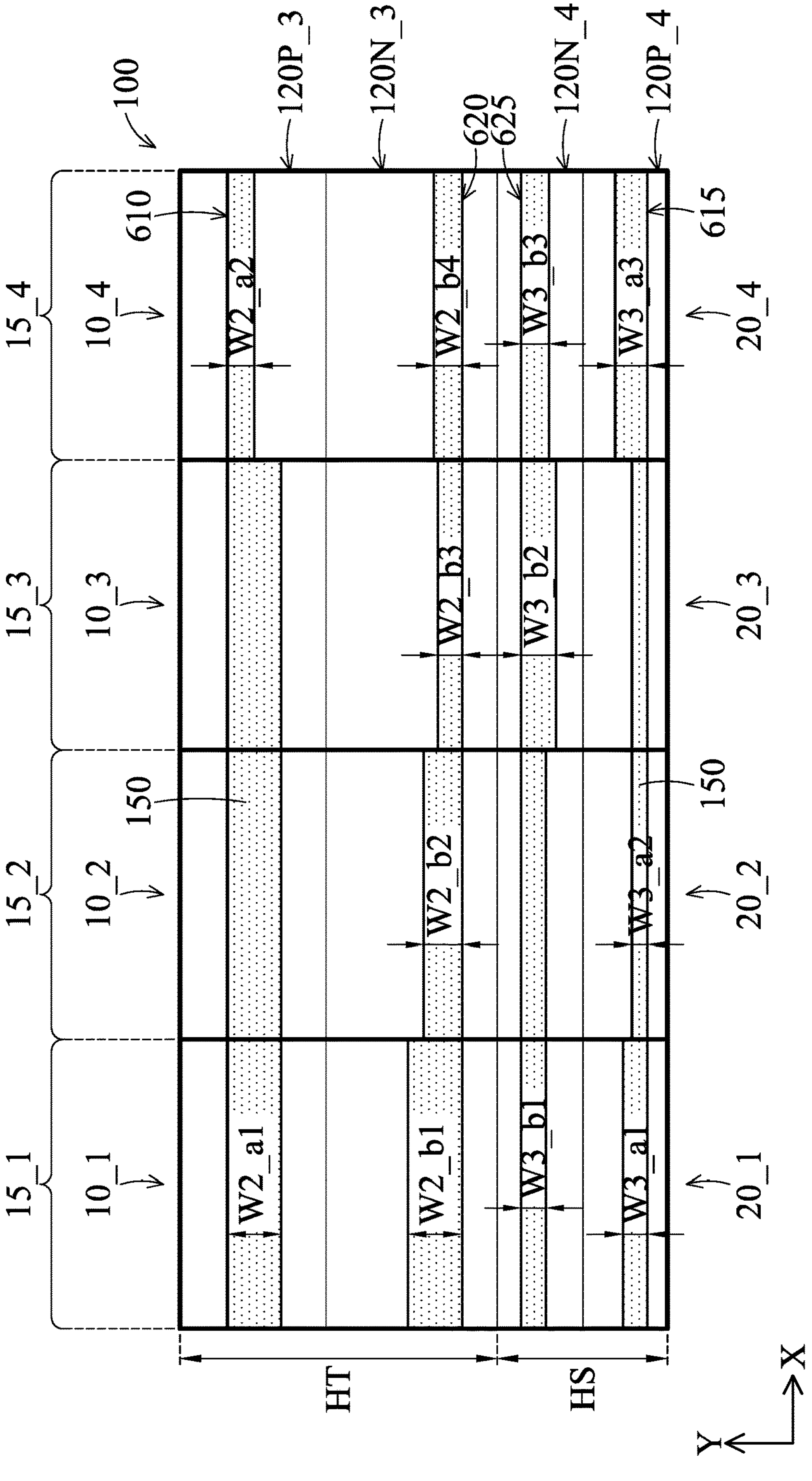
FIG. 6A illustrates the hybrid unit cells in the hybrid cell array of FIG. 1, in accordance with some embodiments of the disclosure.

FIG. 6A illustrates the hybrid unit cells 15_1 through 154 in the hybrid cell array 100 of FIG. 1, in accordance with some embodiments of the disclosure. In FIG. 6A, the hybrid unit cell 15_1 includes the first sub-cell 10_1 and the second sub-cell 201. The hybrid unit cell 15_2 includes the first sub-cell 10_2 and the second sub-cell 20_2. The hybrid unit cell 15_3 includes the first sub-cell 10_3 and the second sub-cell 20_3. The hybrid unit cell 15_4 includes the first sub-cell 10_4 and the second sub-cell 20_4. The hybrid unit cells 15_1 through 15_4 are formed in the same row of the hybrid cell array 100. Furthermore, the outer boundary of each of the first sub-cells 10_1 through 10_4 and the second sub-cells 20_1 through 20_4 is example, and is not intended to limit the disclosure. As described above, the cell height HT of the first sub-cells 10_1 through 10_4 is greater than the cell height HS of the second sub-cells 20_1 through 20_4 in the Y-direction. In some embodiments, the hybrid unit cells 15_1 through 154 have the same cell width in the X-direction. In some embodiments, the hybrid unit cells 15_1 through 15_4 have the different cell widths in the X-direction.

In FIG. 6A, the P-type GAA nanosheet transistors of the first sub-cells 10_1 through 10_4 arranged in the same sub-row of the hybrid cell array 100 have different nanosheet widths. For example, the P-type GAA nanosheet transistors of the first sub-cells 10_1 through 103 have the nanosheet width W2_*a*1. The P-type GAA nanosheet transistors of the first sub-cell 10_4 has the nanosheet width W2_*a*2 that is less than the nanosheet width W2_*a*1 (i.e., W2_*a*1>W2_*a*2). In such embodiment, the nanosheet structures 150 of the P-type GAA nanosheet transistors of the first sub-cells 10_1 through 10_4 are aligned on the same edges (labeled 610) that are away from the interface between the N-type well region 120N_3 and the P-type well region 120P_3 (e.g., they are away from the N-type GAA nanosheet transistors of the first sub-cells 10_1 through 10_4). In some embodiments, the nanosheet structures with different nanosheet widths are formed by removing part of the nanosheet structures using lithography/etching steps.

The N-type GAA nanosheet transistors of the first sub-cells 10_1 through 10_4 arranged in the same sub-row of the hybrid cell array 100 have different nanosheet widths. For example, the N-type GAA nanosheet transistors of the first sub-cells 10_1 through 103 have the nanosheet widths W2_*b*1, W2_*b*2, W2_*b*3 and W2_*b*4, respectively. In some embodiments, the nanosheet width W2_*b*1 is greater than the nanosheet width W2_*b*2, the nanosheet width W2_*b*2 is greater than the nanosheet width W2_*b*4, and the nanosheet width W2_*b*4 is greater than the nanosheet width W2_*b*3, i.e., W2_*b*1>W2_*b*2>W2_*b*4>W2_*b*3. In such embodiment, the nanosheet structures 150 of the N-type GAA nanosheet transistors of the first sub-cells 10_1 through 10_4 are aligned on the same edges (labeled 620) that are away from the interface between the N-type well region 120N_3 and the P-type well region 120P_3 (e.g., they are away from the P-type GAA nanosheet transistors of the first sub-cells 10_1 through 10_4). Moreover, the P-type and N-type GAA nanosheet transistors of the first sub-cells 10_1 through 10_4 form the jogs at the interface between the N-type well region 120N_3 and the P-type well region 120P_3.

In FIG. 6A, the P-type GAA nanosheet transistors of the second sub-cells 20_1 through 20_4 arranged in the same sub-row of the hybrid cell array 100 have different nanosheet widths. For example, the P-type GAA nanosheet transistors of the second sub-cell 20_1 has the nanosheet width W3_*a*1. The P-type GAA nanosheet transistors of the second sub-cells 20_2 and 20_3 have the nanosheet width W3_*a*2 that is less than the nanosheet width W3_*a*1 (i.e., W3_*a*1>W3_*a*2). The P-type GAA nanosheet transistors of the second sub-cell 20_4 has the nanosheet width W3_*a*3 that is greater than the nanosheet width W3_*a*1 (i.e., W3_*a*3>W3_*a*1). In such embodiment, the nanosheet structures 150 of the P-type GAA nanosheet transistors of the second sub-cells 20_1 through 20_4 are aligned on the same edge (labeled 615) that is away from an interface between the N-type well region 120N_4 and the P-type well region 120P_4 (e.g., it is away from the N-type GAA nanosheet transistors of the second sub-cells 20_1 through 20_4).

The N-type GAA nanosheet transistors of the second sub-cells 20 arranged in the same sub-row of the hybrid cell array 100 have different nanosheet widths. For example, the N-type GAA nanosheet transistors of the second sub-cells 20_1 and 20_2 have the nanosheet width W3_*b*1. The N-type GAA nanosheet transistors of the second sub-cell 20_3 has the nanosheet width W3_*b*2 that is greater than the nanosheet width W3_*b*1 (i.e., W3_*b*2>W3_*b*1). The N-type GAA nanosheet transistors of the second sub-cell 20_4 has the nanosheet width W3_*b*3 that is greater than the nanosheet width W3_*b*1 and less than the nanosheet width W3_*b*2 (i.e., W3_*b*2>W3_*b*3>W3_*b*1). In such embodiment, the nanosheet structures 150 of the N-type GAA nanosheet transistors of the second sub-cells 20_1 through 20_4 are aligned on the same edge (labeled 625) that is away from the interface between the N-type well region 120N_4 and the P-type well region 120P_4 (e.g., it is away from the P-type GAA nanosheet transistors of the second sub-cells 20_1 through 20_4). Moreover, the P-type and N-type GAA nanosheet transistors of the second sub-cells 201 through 20_4 form the jogs at the interface between the N-type well region 120N_4 and the P-type well region 120P_4.

In some embodiments, the maximum nanosheet width of the P-type GAA nanosheet transistors in the first sub-cells 10_1 through 10_4 is greater than the maximum nanosheet width of the P-type GAA nanosheet transistors in the second sub-cells 20_1 through 20_4, e.g., W2_*a*1>W3_*a*3. The maximum nanosheet width of the N-type GAA nanosheet transistors in the first sub-cells 10_1 through 10_4 is greater than the maximum nanosheet width of the N-type GAA nanosheet transistors in the second sub-cells 20_1 through 20_4, e.g., W2_*b*1>W3_*b*3.

In some embodiments, the minimum nanosheet width of the P-type (or N-type) GAA nanosheet transistors in the first sub-cells 10_1 through 10_4 is greater than the maximum nanosheet width of the P-type (or N-type) GAA nanosheet transistors in the second sub-cells 20_1 through 20_4.

In some embodiments, the maximum nanosheet width of the P-type (or N-type) GAA nanosheet transistors in the second sub-cells 20_1 through 20_4 is greater than the minimum nanosheet width of the P-type (or N-type)GAA nanosheet transistors in the first sub-cells 10_1 through 10_4, and less than the maximum nanosheet width of the P-type (or N-type)GAA nanosheet transistors in the first sub-cells 10_1 through 10_4.

In some embodiments, the average of the maximum nanosheet widths of the GAA nanosheet transistors in the second sub-cells 20 of the whole-row is equal to or less than the average of the minimum nanosheet widths of the GAA nanosheet transistors in the first sub-cells 10 of the whole-row. For example, the average AVG1 of the maximum nanosheet width W3_*a*1 in the second sub-cell 201, the maximum nanosheet width W3_*b*1 in the second sub-cell 20_2, the maximum nanosheet width W3_*b*2 in the second sub-cell 20_3 and the maximum nanosheet width W3_*b*2 in the second sub-cell 20_4 is less than or equal to the average AVG2 of the minimum nanosheet width W2_*a*1 in the first sub-cell 10_1, the minimum nanosheet width W2_*b*2 in the first sub-cell 102, the minimum nanosheet width W2_*b*3 in the first sub-cell 10_3 and the minimum nanosheet width W2_*a*2 in the first sub-cell 104, i.e., AVG1<AVG2, where AVG1=(W3_*a*1+W3_*b*1+W3_*b*2+W3_*b*2)/4 and AVG2=(W2_*a*1+W2_*b*2+W2_*b*3+W2_*a*2)/4.

In the hybrid cell array 100, the power lines (e.g., VDD line or VSS line) of the sub-cells 10 and 20 extend in the X-direction and disposed over the boundary between the first sub-cell 10 and the second sub-cell 20. For example, a VSS line (not shown) extends in the X-direction and disposed over the boundary between the N-type well regions 120N_3 and 120N_4. In such embodiment, the aligned edges of the nanosheet structures 150 of the N-type GAA nanosheet transistors of the first sub-cells 10_1 through 10_4 are equidistant from the VSS line. Similarly, the aligned edges of the nanosheet structures 150 of the N-type GAA nanosheet transistors of the second sub-cells 20_1 through 20_4 are equidistant from the VSS line.

Figure 6B:
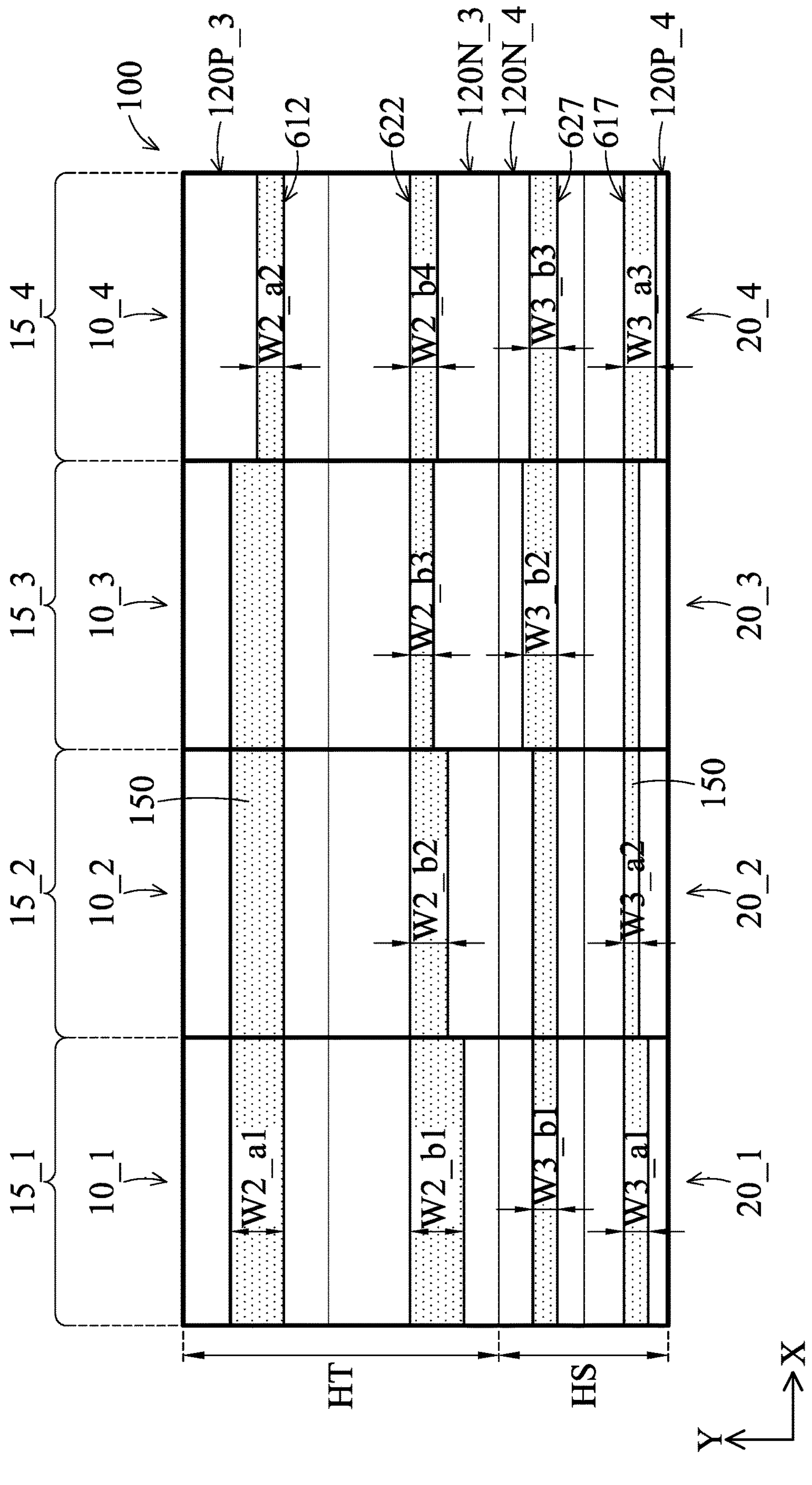
FIG. 6B illustrates the hybrid unit cells in the hybrid cell array of FIG. 1, in accordance with some embodiments of the disclosure.

FIG. 6B illustrates the hybrid unit cells 15_1 through 154 in the hybrid cell array 100 of FIG. 1, in accordance with some embodiments of the disclosure. In FIG. 6B, the hybrid unit cells 15_1 through 15_4 are formed in the same row of the hybrid cell array 100

In FIG. 6B, the P-type GAA nanosheet transistors of the first sub-cells 10_1 through 10_4 arranged in the same sub-row of the hybrid cell array 100 have different nanosheet widths. In such embodiment, the nanosheet structures 150 of the P-type GAA nanosheet transistors of the first sub-cells 10_1 through 10_4 are aligned on the same edges (labeled 612) that face the interface between the N-type well region 120N_3 and the P-type well region 120P_3 (e.g., they are close to the N-type GAA nanosheet transistors of the first sub-cells 10_1 through 10_4).

The N-type GAA nanosheet transistors of the first sub-cells 10_1 through 10_4 arranged in the same sub-row of the hybrid cell array 100 have different nanosheet widths. In such embodiment, the nanosheet structures 150 of the N-type GAA nanosheet transistors of the first sub-cells 10_1 through 10_4 are aligned on the same edges (labeled 622) that face the interface between the N-type well region 120N_3 and the P-type well region 120P_3 (e.g., they are close to the P-type GAA nanosheet transistors of the first sub-cells 10_1 through 10_4). Moreover, the P-type and N-type GAA nanosheet transistors of the first sub-cells 10_1 through 10_4 form the jogs at the N-type well region 120N_3 and the P-type well region 120P_3.

In FIG. 6B, the P-type GAA nanosheet transistors of the second sub-cells 20_1 through 20_4 arranged in the same sub-row of the hybrid cell array 100 have different nanosheet widths. In such embodiment, the nanosheet structures 150 of the P-type GAA nanosheet transistors of the second sub-cells 20_1 through 20_4 are aligned on the same edges (labeled 617) that face the interface between the N-type well region 120N_4 and the P-type well region 120P_4 (e.g., they are close to the N-type GAA nanosheet transistors of the second sub-cells 20_1 through 20_4).

The N-type GAA nanosheet transistors of the second sub-cells 20_1 through 20_4 arranged in the same sub-row of the hybrid cell array 100 have different nanosheet widths. In such embodiment, the nanosheet structures 150 of the N-type GAA nanosheet transistors of the second sub-cells 20_1 through 20_4 are aligned on the same edges (labeled 627) that face the interface between the N-type well region 120N_4 and the P-type well region 120P_4 (e.g., they are close to the P-type GAA nanosheet transistors of the second sub-cells 20_1 through 20_4). Moreover, the P-type and N-type GAA nanosheet transistors of the second sub-cells 20_1 through 20_4 form the jogs at the N-type well region 120N_4 and the P-type well region 120P_4.

In FIG. 6B, a VSS line (not shown) extends in the X-direction and disposed over the boundary between the N-type well regions 120N_3 and 120N_4. In such embodiment, the aligned edges of the nanosheet structures 150 of the N-type GAA nanosheet transistors of the first sub-cells 10_1 through 10_4 are not equidistant from the VSS line. Similarly, the aligned edges of the nanosheet structures 150 of the N-type GAA nanosheet transistors of the second sub-cells 20_1 through 20_4 are not equidistant from the VSS line. In some embodiments, the metal layer over a gap between the nanosheet structure 150 and the VSS line is used for routing.

Figure 6C:
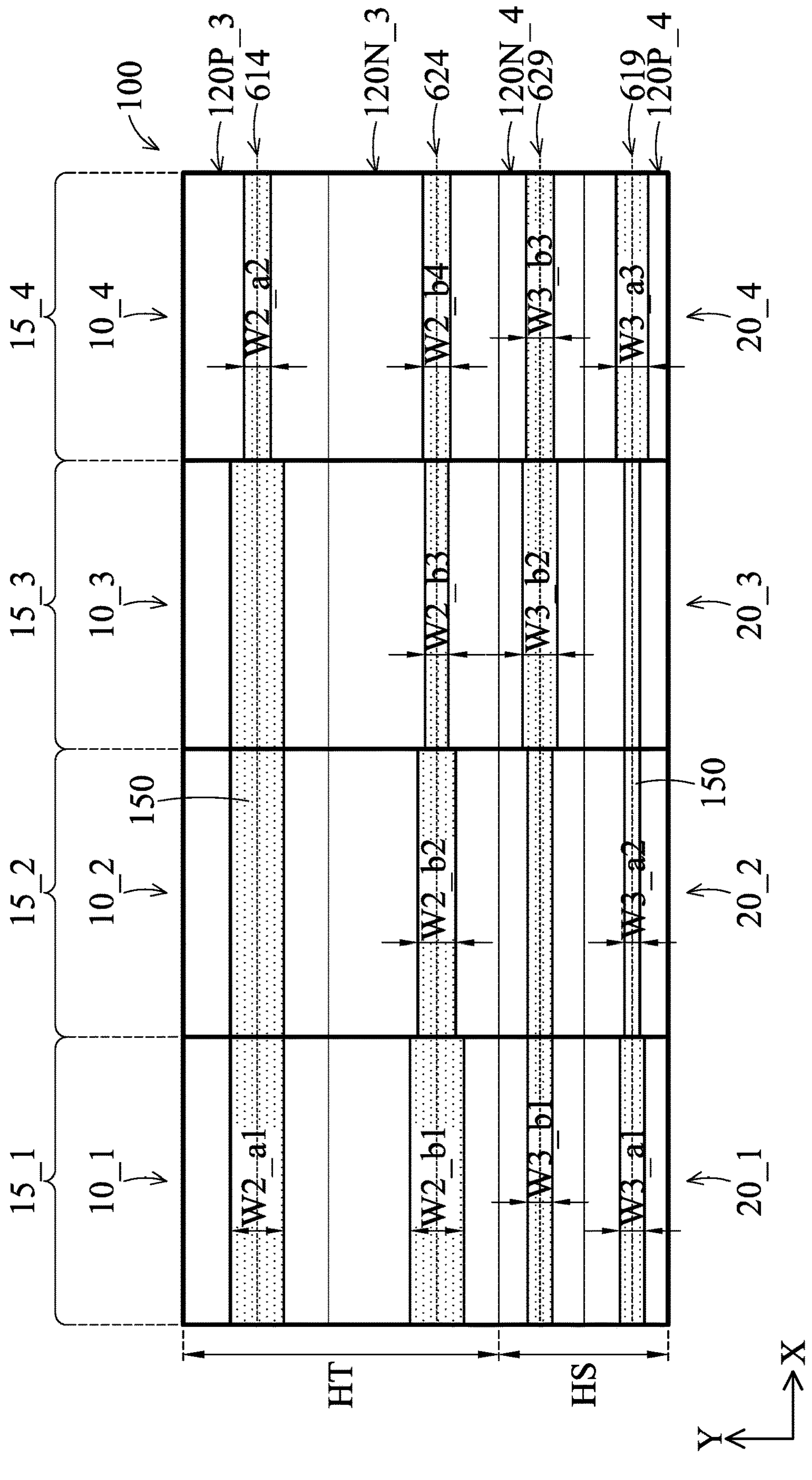
FIG. 6C illustrates the hybrid unit cells in the hybrid cell array of FIG. 1, in accordance with some embodiments of the disclosure.

FIG. 6C illustrates the hybrid unit cells 15_1 through 154 in the hybrid cell array 100 of FIG. 1, in accordance with some embodiments of the disclosure. In FIG. 6C, the hybrid unit cells 15_1 through 15_4 are formed in the same row of the hybrid cell array 100.

In FIG. 6C, the P-type GAA nanosheet transistors of the first sub-cells 10_1 through 10_4 arranged in the same sub-row of the hybrid cell array 100 have different nanosheet widths. In such embodiment, the nanosheet structures 150 of the P-type GAA nanosheet transistors of the first sub-cells 10_1 through 10_4 are aligned along the centerline (labeled 614) in the X-direction. The N-type GAA nanosheet transistors of the first sub-cells 10_1 through 10_4 arranged in the same sub-row of the hybrid cell array 100 have different nanosheet widths. In such embodiment, the nanosheet structures 150 of the N-type GAA nanosheet transistors of the first sub-cells 10_1 through 10_4 are aligned the centerline (labeled 624) in the X-direction. Moreover, the P-type and N-type GAA nanosheet transistors of the first sub-cells 10_1 through 10_4 form the jogs at two sided facing two different boundaries between the N-type and P-type well regions.

In FIG. 6C, the P-type GAA nanosheet transistors of the second sub-cells 20_1 through 20_4 arranged in the same sub-row of the hybrid cell array 100 have different nanosheet widths. In such embodiment, the nanosheet structures 150 of the P-type GAA nanosheet transistors of the second sub-cells 20_1 through 20_4 are aligned the centerline (labeled 619) in the X-direction. The N-type GAA nanosheet transistors of the second sub-cells 20_1 through 20_4 arranged in the same sub-row of the hybrid cell array 100 have different nanosheet widths. In such embodiment, the nanosheet structures 150 of the N-type GAA nanosheet transistors of the second sub-cells 20_1 through 20_4 are aligned the centerline (labeled 629) in the X-direction. Moreover, the P-type and N-type GAA nanosheet transistors of the second sub-cells 20_1 through 20_4 form the jogs at two sided facing two different boundaries between the N-type and P-type well regions.

Figure 7A:
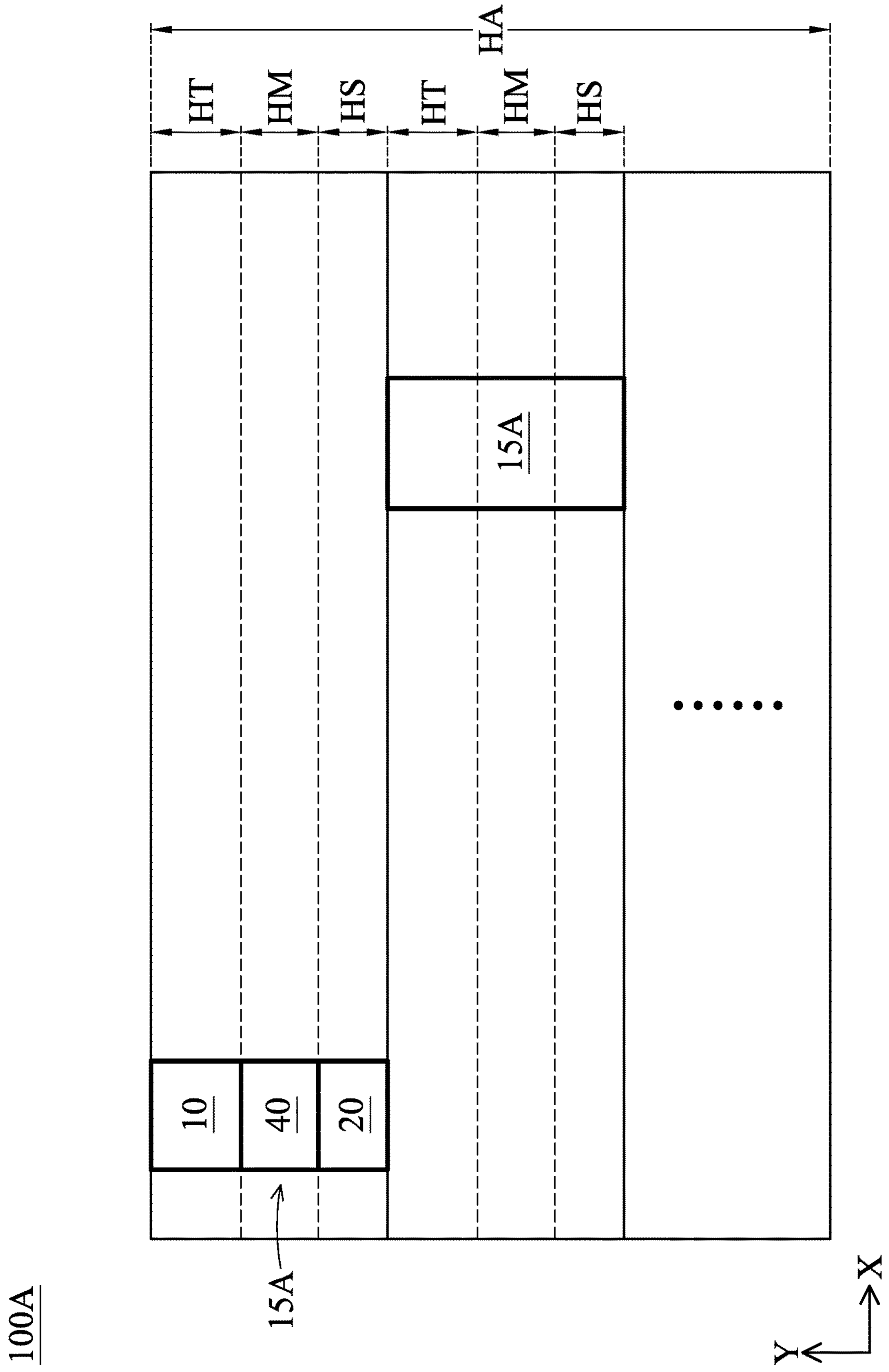
FIG. 7A is a simplified diagram of a hybrid cell array of an IC, in accordance with some embodiments of the disclosure.

FIG. 7A is a simplified diagram of a hybrid cell array 100A of an IC, in accordance with some embodiments of the disclosure. The hybrid cell array 100A includes multiple hybrid unit cells 15A arranged in rows. Each hybrid unit cell 15A includes more than two types of sub-cells, and each type of sub-cell has an individual cell height. For example, the hybrid unit cell 15A includes the first sub-cell 10, the second sub-cell 20 and fourth sub-cell 40. The first sub-cell 10 has the cell height HT along the Y-direction in the layout, the second sub-cell 20 has the cell height HS along the Y-direction in the layout, and the fourth sub-cell 40 has the cell height HM along the Y-direction in the layout. The cell height HT of the first sub-cell 10 is higher than the cell height HM of the fourth sub-cell 40, and the cell height HM of the fourth sub-cell 40 is higher than the cell height of the second sub-cell 20, i.e., $HS<HM<HT$. In some embodiments, the cell height HM of the fourth sub-cell 40 is equal to the cell height HH of the third sub-cell 30.

In FIG. 7A, the rows of the hybrid unit cells 15A are arranged repeatedly in the hybrid cell array 100A. In each hybrid unit cell 15A, the fourth sub-cell 40 is disposed between the first sub-cell 10 and the second sub-cell 20, i.e., the fourth sub-cell 40 is sandwiched by the first sub-cell 10 and the second sub-cell 20 in the Y-direction.

In some embodiments, the second sub-cell 20 is disposed between the first sub-cell 10 and the fourth sub-cell 40. In some embodiments, the first sub-cell 10 is disposed between the second sub-cell 20 and the fourth sub-cell 40. In some embodiments, the regular cell array 100A of FIG. 7A and the hybrid cell array 100 of FIG. 1 have the same array height HA along the Y-direction in the layout. In some embodiments, the number of rows corresponding to the sub cells in the hybrid cell array 100A of FIG. 7A is equal to the number of rows corresponding to the sub cells in the hybrid cell array 100 of FIG. 1.

Figure 7B:
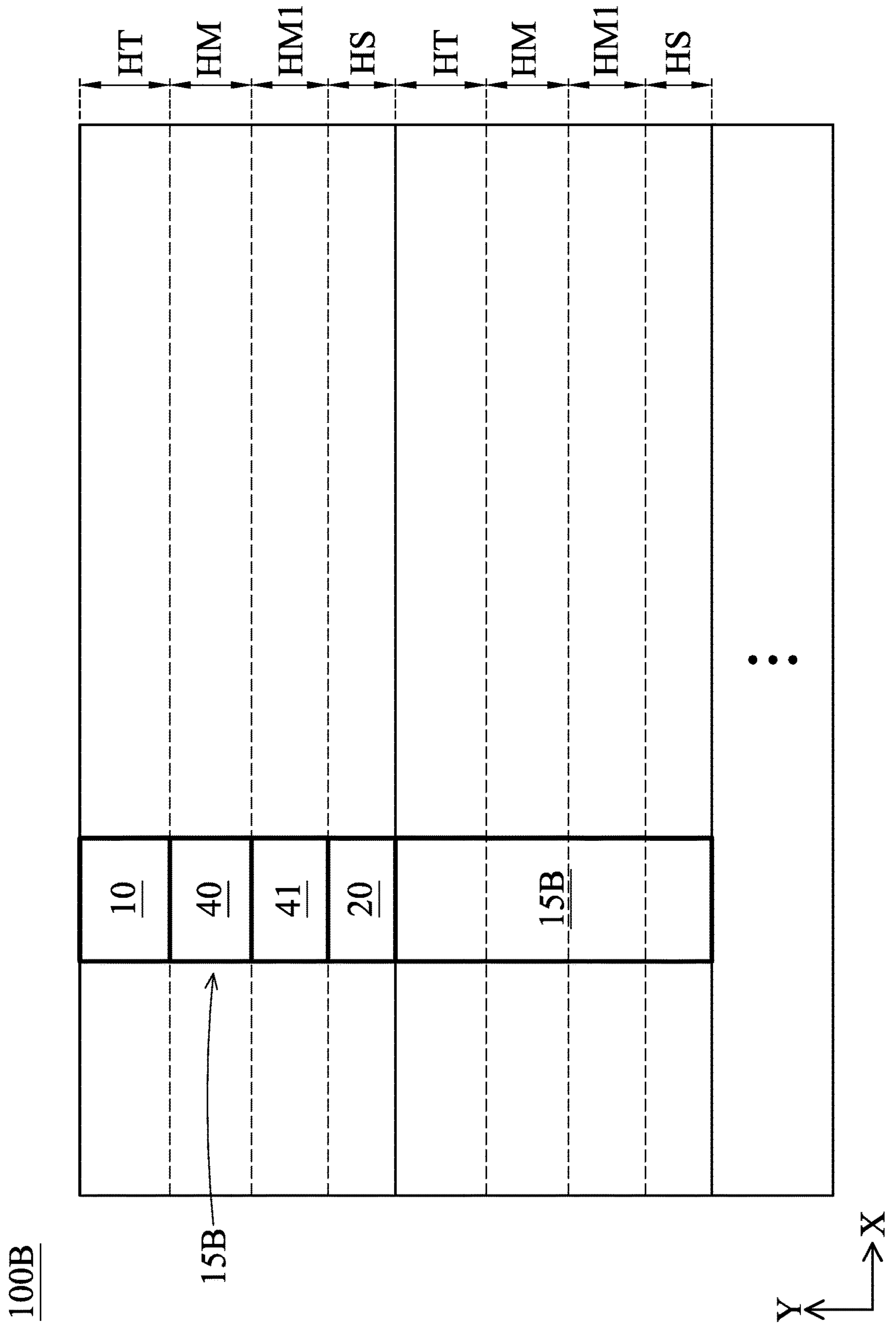
FIG. 7B is a simplified diagram of a hybrid cell array of an IC, in accordance with some embodiments of the disclosure.

FIG. 7B is a simplified diagram of a hybrid cell array 100B of an IC, in accordance with some embodiments of the disclosure. The hybrid cell array 100B includes multiple hybrid unit cells 15B arranged in rows. Each hybrid unit cell 15B includes four types of sub-cells, and each type of sub-cell has an individual cell height. For example, the sub-cells 10, 20, 40 and 41 respectively have cell heights of HT, HS, HM and HM1 along the Y-direction in the layout. In some embodiments, the cell height HM is equal to the cell height HM1, i.e., HM=HM1. In some embodiments, the cell height HM is greater than the cell height HM1, i.e., HM>HM1. In some embodiments, the regular cell array 100B of FIG. 7B and the hybrid cell array 100 of FIG. 1 have the same array height HA along the Y-direction in the layout. In some embodiments, the number of rows corresponding to the sub cells in the hybrid cell array 100B of FIG. 7B is equal to the number of rows corresponding to the sub cells in the hybrid cell array 100 of FIG. 1.

Figure 8A:
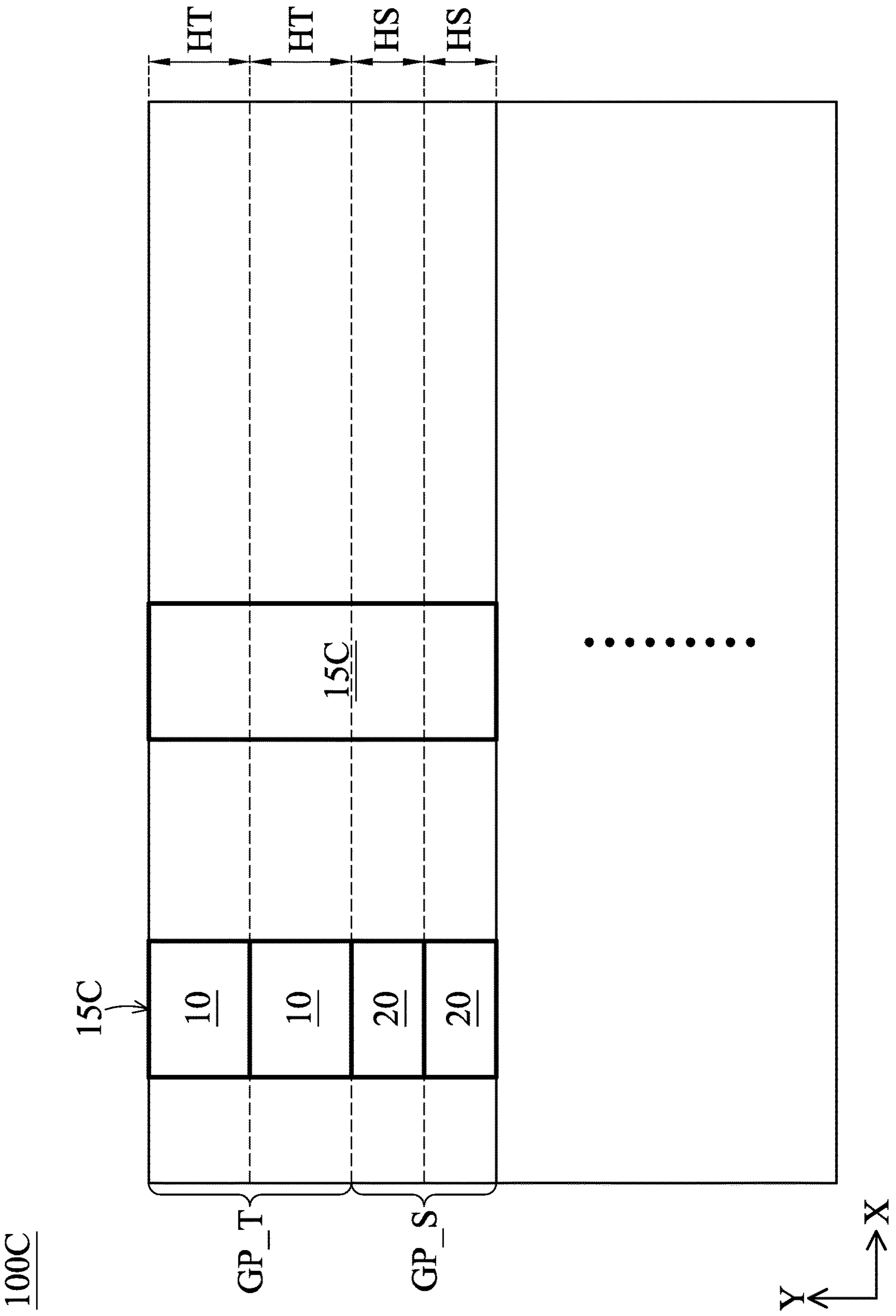
FIG. 8A is a simplified diagram of a hybrid cell array of an IC, in accordance with some embodiments of the disclosure.

FIG. 8A is a simplified diagram of a hybrid cell array 100C of an IC, in accordance with some embodiments of the disclosure. The hybrid cell array 100C includes multiple hybrid unit cells 15C arranged in rows. Each hybrid unit cell 15C includes two types of sub-cells, and each type of sub-cell has an individual cell height. For example, the first sub-cell 10 has the cell height HT along the Y-direction in the layout, and the second sub-cell 20 has the same cell height HS along the Y-direction in the layout.

Each hybrid unit cell 15C is divided into two groups GP_T and GP_S. Each of the groups GP_T and GP_S includes the same type of sub-cells in two adjacent rows. For example, the group GP_T includes the first sub-cells 10 in two adjacent rows, and the sub-group GP_S includes the second sub-cells 20 in two adjacent rows. In some embodiments, each hybrid unit cell 15C is divided into more than two groups.

Figure 8B:
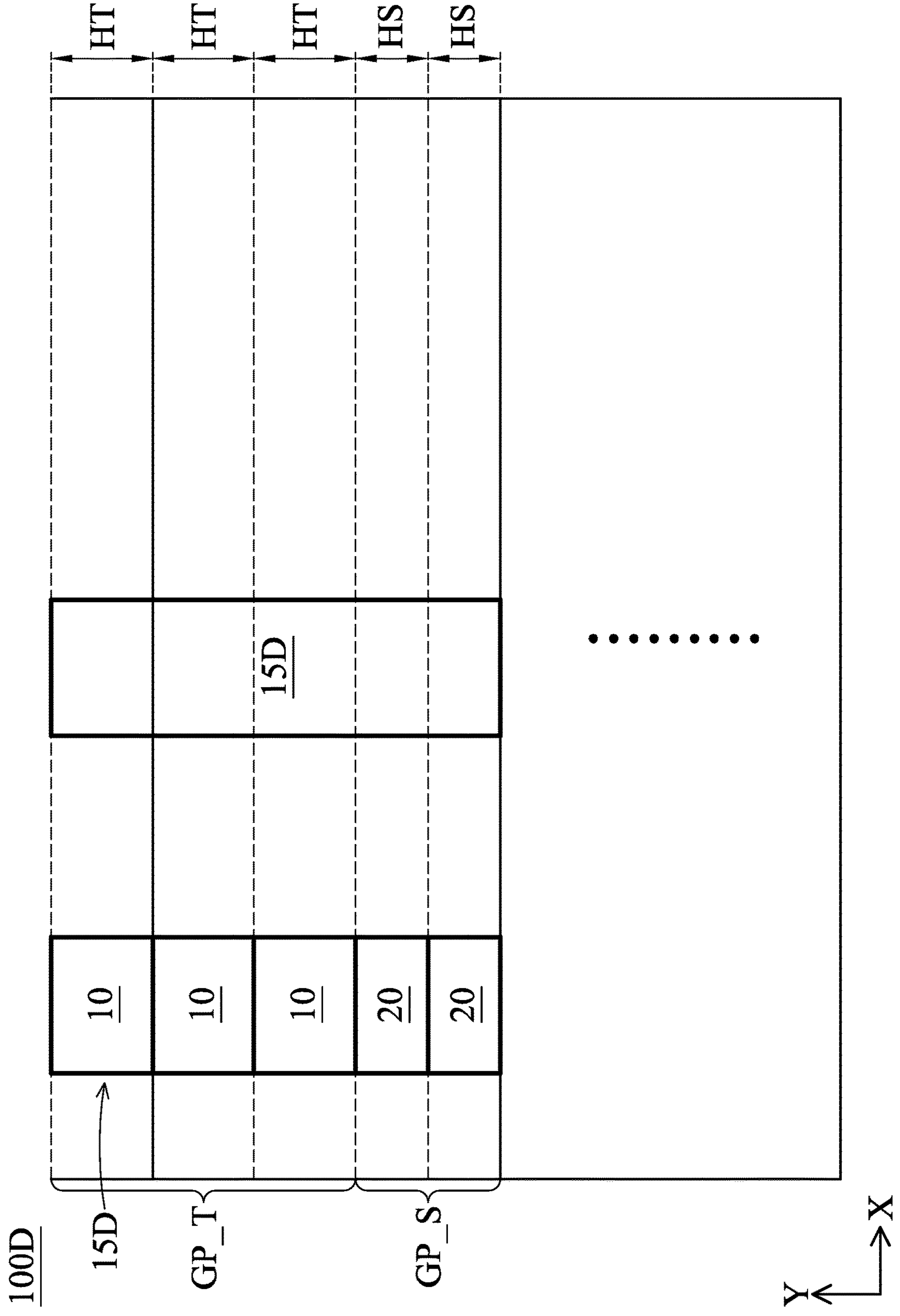
FIG. 8B is a simplified diagram of a hybrid cell array of an IC, in accordance with some embodiments of the disclosure.

FIG. 8B is a simplified diagram of a hybrid cell array 100D of an IC, in accordance with some embodiments of the disclosure. The hybrid cell array 100D includes multiple hybrid unit cells 15D arranged in rows. Each hybrid unit cell 15D includes two types of sub-cells, and each type of sub-cell has an individual cell height. For example, the first sub-cell 10 has the cell height HT along the Y-direction in the layout, and the second sub-cell 20 has the same cell height HS along the Y-direction in the layout.

Each hybrid unit cell 15D is divided into two groups GP_T and GP_S, The group GP_T includes the first sub-cells 10 in three adjacent rows, and the group GP_S includes the second sub-cells 20 in two adjacent rows. Therefore, the sub-groups GP_T and GP_S have different numbers of rows corresponding to the sub-cells.

Embodiments of semiconductor devices are provided. A hybrid cell array is formed by the hybrid unit cells arranged in rows. Each hybrid unit cell includes the first sub-cell 10 with the cell height HT and the second sub-cell 20 with the cell height HS. The GAA nanosheet transistors of the first sub-cell 10 have wider nanosheet widths than the GAA nanosheet transistors of the second sub-cell 20. Furthermore, the different nanosheet widths allows further speed and power partitioning within each of the sub-cells 10 and 20.

In some embodiments, a semiconductor structure is provided. The semiconductor structure includes a hybrid unit cell. The hybrid unit cell includes at least one first sub-cell having a first cell height and at least one second sub-cell having a second cell height. The first sub-cell includes a plurality of first gate-all-around (GAA) nanosheet transistors. The second sub-cell includes a plurality of second GAA nanosheet transistors. The first cell height is higher than the second cell height, and the first GAA nanosheet transistor has a wider nanosheet width than the second GAA nanosheet transistor.

In some embodiments, a semiconductor structure is provided. The semiconductor structure includes a hybrid cell array. The hybrid cell array includes a plurality of hybrid unit cells in a row. Each of the hybrid unit cells includes a first sub-cell having a first cell height and arranged in a first sub-row of the row, and a second sub-cell having a second cell height and arranged in a second sub-row of the row. The first cell height is higher than the second cell height. The plurality of first gate-all-around (GAA) nanosheet transistors of the first sub-cells in the first sub-row have different nanosheet widths, and a plurality of second GAA nanosheet transistors of the second sub-cells in the second sub-row have different nanosheet widths.

In some embodiments, a semiconductor structure is provided. The semiconductor structure includes a hybrid cell array and a regular cell array. The hybrid cell array includes a plurality of hybrid unit cells. Each of the hybrid unit cells includes a first sub-cell having a first cell height and a second sub-cell having a second cell height. The cell height of the hybrid unit cell is equal to the sum of the first and second cell heights. The regular cell array includes a plurality of logic cells having a third cell height. The third cell height is greater than the second cell height and less than the first cell height. The first gate-all-around (GAA) nanosheet transistors in the first sub-cells have wider nanosheet widths than the second GAA nanosheet transistors in the second sub-cells.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure, comprising:
a hybrid unit cell, comprising:
at least one first sub-cell having a first cell height, wherein the first sub-cell comprises a plurality of first gate-all-around (GAA) nanosheet transistors;
at least one second sub-cell having a second cell height, wherein the second sub-cell comprises a plurality of second GAA nanosheet transistors; and
at least one third sub-cell having a third cell height, wherein the third sub-cell comprises a plurality of third GAA nanosheet transistors,
wherein the first cell height is higher than the third cell height, the third cell height is higher than the second cell height, and the first GAA nanosheet transistor has a wider nanosheet width than the second GAA nanosheet transistor.

2. The semiconductor structure as claimed in claim 1, wherein the first sub-cell and the second sub-cell have the same cell width.

3. The semiconductor structure as claimed in claim 1, wherein the hybrid unit cell is divided into a first group of first sub-cells and a second group of second sub-cells, wherein the number of the first sub-cells in the first group is equal to the number of the second sub-cells in the second group.

4. The semiconductor structure as claimed in claim 1, wherein the hybrid unit cell is divided into a first group of first sub-cells and a second group of second sub-cells, wherein the number of the first sub-cells in the first group is different from the number of the second sub-cells in the second group.

5. The semiconductor structure as claimed in claim 1, wherein the first sub-cell comprises a first P-type GAA nanosheet transistor and a first N-type GAA nanosheet transistor, and the second sub-cell comprises a second P-type GAA nanosheet transistor and a second N-type GAA nanosheet transistor.

6. The semiconductor structure as claimed in claim 5, wherein the first P-type GAA nanosheet transistor and the first N-type GAA nanosheet transistor in the first sub-cell have a first nanosheet width, and the second P-type GAA nanosheet transistor and the second N-type GAA nanosheet transistor in the second sub-cell have a second nanosheet width, wherein the first nanosheet width is greater than the second nanosheet width.

7. The semiconductor structure as claimed in claim 5, wherein a first nanosheet width of the first P-type GAA nanosheet transistor is greater than a second nanosheet width of the first N-type GAA nanosheet transistor, and a third nanosheet width of the second P-type GAA nanosheet transistor is greater than a fourth nanosheet width of the second N-type GAA nanosheet transistor.

8. The semiconductor structure as claimed in claim 7, wherein the second nanosheet width is greater than the third nanosheet width.

9. The semiconductor structure as claimed in claim 7, wherein the second nanosheet width is greater than the fourth nanosheet width and less than the third nanosheet width.

10. A semiconductor structure, comprising:
a hybrid cell array comprising a plurality of hybrid unit cells in a row, wherein each of the hybrid unit cells comprises:
a first sub-cell having a first cell height and arranged in a first sub-row of the row;
a second sub-cell having a second cell height and arranged in a second sub-row of the row; and
a third sub-cell having a third cell height and arranged in a third sub-row of the row,
wherein the first cell height is higher than the third cell height, and the third cell height is higher than the second cell height,
wherein a plurality of first gate-all-around (GAA) nanosheet transistors of the first sub-cells in the first sub-row have different nanosheet widths, and a plurality of second GAA nanosheet transistors of the second sub-cells in the second sub-row have different nanosheet widths.

11. The semiconductor structure as claimed in claim 10, wherein a minimum nanosheet width of the first GAA nanosheet transistors in the first sub-row is greater than a maximum nanosheet width of the second GAA nanosheet transistors in the second sub-row.

12. The semiconductor structure as claimed in claim 10, wherein a maximum nanosheet width of the second GAA nanosheet transistors in the second sub-row is greater than a minimum nanosheet width of the first GAA nanosheet transistors in the first sub-row and less than a maximum nanosheet width of the first GAA nanosheet transistors in the first sub-row.

13. The semiconductor structure as claimed in claim 10, wherein nanosheet structures of the first GAA nanosheet transistors of the first sub-cells in the first sub-row are aligned on the same edges of the nanosheet structures that are away from or close to an interface between an N-type well region and a P-type well region of the first sub-cells.

14. The semiconductor structure as claimed in claim 10, wherein nanosheet structures of the first GAA nanosheet transistors of the first sub-cells in the first sub-row are aligned along a centerline of the nanosheet structures.

15. A semiconductor structure, comprising:
a hybrid cell array, comprising:
a plurality of hybrid unit cells, wherein each of the hybrid unit cells comprises:
a first sub-cell having a first cell height;
a third sub-cell having a third cell height; and
a second sub-cell having a second cell height, wherein a cell height of the hybrid unit cell is equal to a sum of the first cell height, the second cell height, and the third cell height; and
a regular cell array, comprising:
a plurality of logic cells having a fourth cell height, wherein the fourth cell height is greater than the second cell height and less than the first cell height,
wherein a plurality of first gate-all-around (GAA) nanosheet transistors in the first sub-cells have wider nanosheet widths than a plurality of second GAA nanosheet transistors in the second sub-cells.

16. The semiconductor structure as claimed in claim 15, wherein the hybrid cell array and the regular cell array have the same array height.

17. The semiconductor structure as claimed in claim 15, wherein a minimum nanosheet width of the first GAA nanosheet transistors of the first sub-cells is greater than a maximum nanosheet width of the second GAA nanosheet transistors of the second sub-cells.

18. The semiconductor structure as claimed in claim 15, wherein a maximum nanosheet width of the second GAA nanosheet transistors of the second sub-cells is greater than a minimum nanosheet width of the first GAA nanosheet transistors of the first sub-cells and less than a maximum nanosheet width of the first GAA nanosheet transistors of the first sub-cells.

19. The semiconductor structure as claimed in claim 15, wherein the first GAA nanosheet transistors of the first sub-cells in the same row of the hybrid cell array have the same nanosheet widths, and the second GAA nanosheet transistors of the second sub-cells in the same row of the hybrid cell array have the same nanosheet widths.

20. The semiconductor structure as claimed in claim 15, wherein the first GAA nanosheet transistors of the first sub-cells in the same row of the hybrid cell array have different nanosheet widths, and the second GAA nanosheet transistors of the second sub-cells in the same row of the hybrid cell array have different nanosheet widths.

* * * * *